(12) United States Patent
Ozatay et al.

(10) Patent No.: US 8,164,940 B2
(45) Date of Patent: Apr. 24, 2012

(54) READ/WRITE STRUCTURES FOR A THREE DIMENSIONAL MEMORY

(75) Inventors: Ozhan Ozatay, Istanbul (TR); Bruce D. Terris, Sunnyvale, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 322 days.

(21) Appl. No.: 12/638,627

(22) Filed: Dec. 15, 2009

(65) Prior Publication Data

US 2011/0141792 A1 Jun. 16, 2011

(51) Int. Cl.
*G11C 11/063* (2006.01)
(52) U.S. Cl. .................... 365/130; 365/80; 365/173
(58) Field of Classification Search .............. 365/80, 365/85, 87, 130
See application file for complete search history.

(56) References Cited

U.S. PATENT DOCUMENTS

| | | | |
|---|---|---|---|
| 6,834,005 B1 | 12/2004 | Parkin | |
| 7,236,386 B2 | 6/2007 | Parkin | |
| 7,388,776 B1 * | 6/2008 | Fontana et al. | 365/173 |
| 7,514,271 B2 | 4/2009 | Gaidis | |
| 7,652,915 B2 * | 1/2010 | Folks et al. | 365/171 |
| 7,706,179 B2 * | 4/2010 | Khizroev | 365/173 |
| 2006/0028866 A1 | 2/2006 | Parkin | |
| 2007/0198618 A1 | 8/2007 | Kim | |
| 2007/0262301 A1 | 11/2007 | Cowburn | |
| 2008/0026880 A1 | 1/2008 | Zheng | |
| 2008/0080092 A1 | 4/2008 | Kim | |
| 2008/0080234 A1 | 4/2008 | Iwata | |
| 2008/0137395 A1 | 6/2008 | Hwang | |
| 2008/0137521 A1 | 6/2008 | Lee | |
| 2008/0152954 A1 | 6/2008 | Lim | |
| 2008/0204946 A1 | 8/2008 | Ochiai | |
| 2009/0040883 A1 | 2/2009 | Kim | |
| 2009/0097365 A1 | 4/2009 | Lee | |
| 2010/0328986 A1 * | 12/2010 | Tsai et al. | 365/80 |

FOREIGN PATENT DOCUMENTS

KR  1020080053101 A  12/2008

* cited by examiner

*Primary Examiner* — Tan T. Nguyen
(74) *Attorney, Agent, or Firm* — Duft Bornsen & Fishman, LLP

(57) ABSTRACT

Read/write structures for three-dimensional memories are disclosed. In one embodiment, a three-dimensional memory includes a plurality of data storage layers fabricated in parallel on top of one another to form a three-dimensional structure. Each data storage layer is able to store bits of data in the form of magnetic domains. The memory further includes a column of write elements that is operable to write a column of magnetic domains to the first data storage layer representing a column of bits. The first data storage layer is patterned into a plurality of magnetic conductors aligned transverse to the column of write elements. A control system may inject spin-polarized current pulses in the magnetic conductors to transfer the column of magnetic domains laterally within the first data storage layer. The control system may transfer of the column of magnetic domains perpendicularly from the first data storage layer to another data storage layer.

25 Claims, 24 Drawing Sheets

READ/WRITE STRUCTURES FOR A THREE DIMENSIONAL MEMORY

BACKGROUND

1. Field of the Invention

The invention is related to the field of solid-state memories and, in particular, to a magnetic memory comprised of a three-dimensional stack of layers.

2. Statement of the Problem

Solid-state memory is a nonvolatile storage medium that uses no moving parts. Some examples of solid-state memory are flash memory and MRAM (magnetoresistive random access memory). Solid-state memories provide advantages over conventional disk drives in that data transfers to and from solid-state memories take place at a much higher speed than is possible with electromechanical disk drives. Solid-state memories may also have a longer operating life and may be more durable due to the lack of moving parts.

Solid-state memories are typically fabricated as a two-dimensional array of memory cells, also referred to as cross-point memory arrays. However, newer solid-state memories have been suggested that are three-dimensional. For example, U.S. Pat. No. 7,388,776 and U.S. Pat. No. 7,606,605 each describe a three-dimensional memory for storing data, and are incorporated by reference as if fully included herein. A three-dimensional memory includes a plurality of data storage layers that are stacked on top of one another. Each of these data storage layers is operable to store bits of data in the form of magnetic domains. If a page of bits is written into a first one of the data storage layers, the page of bits may be transferred up the stack to a secondary data storage layer. After the page of bits is transferred, a new page of bits may be written into the first data storage layer. This process may continue to store data up the stack of data storage layers. The three-dimensional memory allows for a large increase in storage capacity, and thus, the storage capacity of solid-state memories may approach the storage capacity of electromechanical disk drives.

SUMMARY

Embodiments described herein provide read/write structures for a three-dimensional memory. More particularly, a read/write structure may include a column of write elements that are operable to write a column of magnetic domains (representing bits of data) to a data storage layer in the three-dimensional memory. After the column of magnetic domains is written into the data storage layer, the column of magnetic domains may be shifted or transferred laterally within the data storage layer to neighboring domain sites. For example, the data storage layer may include a plurality of magnetic conductors that store magnetic domains and run transverse to the column of write elements. Spin-polarized current pulses may be injected into the magnetic conductors to transfer the column of magnetic domains to the neighboring domain sites using spin-torque transfer. Then the column of write elements may write another column of magnetic domains to the data storage layer. The columns of magnetic domains may also be transferred vertically (i.e., in the Z direction) between data storage layers of the three-dimensional memory.

The bit size and overall storage density of a three-dimensional memory have previously been limited by how closely the write elements (and read elements) can be fabricated next to each other. Also, if a full array of write elements is fabricated to write a page of bits, this fabrication can be complex and expensive. In the embodiments herein, a column of write elements is used instead of a full array of write elements, which makes fabrication of the read/write structure easier and less expensive. Also, because the bits are written to a data storage layer in columns and then transferred laterally within the data storage layer, the bits may be packed closer together in the data storage layer. Prior three-dimensional memories were limited in density by how closely the write elements could be fabricated next to each other in an array. By writing a column of bits and transferring the bits laterally, the bits can actually be stored closer to one another with the only limitation being the thermal stability requirements of the memory. Thus, the bit density of the three-dimensional memory may be increased.

One embodiment comprises a three-dimensional memory that includes a plurality of data storage layers on top of one another to form a three-dimensional structure, where each data storage layer is able to store bits of data in the form of magnetic domains. The three-dimensional memory further includes a column of write elements, proximate to a first one of the data storage layers, that is operable to write a column of magnetic domains to the first data storage layer representing a column of bits. The first data storage layer includes a plurality of magnetic conductors aligned transverse to the column of write elements. The magnetic conductors are operable to transfer the column of magnetic domains laterally within the first data storage layer.

In another embodiment, the three-dimensional memory further includes a control system operable to inject spin-polarized current pulses in the magnetic conductors to transfer the column of magnetic domains laterally within the first data storage layer to a neighboring domain site. The control system may be further operable to transfer of the column of magnetic domains perpendicularly from the first data storage layer to another data storage layer (i.e., up the stack of data storage layers).

In another embodiment, the three-dimensional memory further includes a column of read elements, proximate to the first data storage layer, that is operable to sense the column of magnetic domains from the first data storage layer to read the column of bits.

In another embodiment, the write element and read elements are integrated to form a column of read/write elements.

Another embodiment comprises a method of fabricating a three-dimensional memory. The method includes forming a plurality of write elements in a column. The method further includes forming a first data storage layer above the write elements, where the first data storage layer includes a plurality of magnetic conductors that are transverse to the column of write elements. The method further includes forming one or more secondary data storage layers on the first data storage layer, where the secondary data storage layer includes a plurality of magnetic conductors that are transverse to the magnetic conductors in the first data storage layer.

Other exemplary embodiments may be described below.

DESCRIPTION OF THE DRAWINGS

Some embodiments of the present invention are now described, by way of example only, and with reference to the accompanying drawings. The same reference number represents the same element or the same type of element on all drawings.

DESCRIPTION OF THE EMBODIMENTS

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention, and are to be construed as being without limitation to such specifically recited examples and conditions. As a result, the invention is not limited to the specific embodiments or examples described below, but by the claims and their equivalents.

Figure 1:
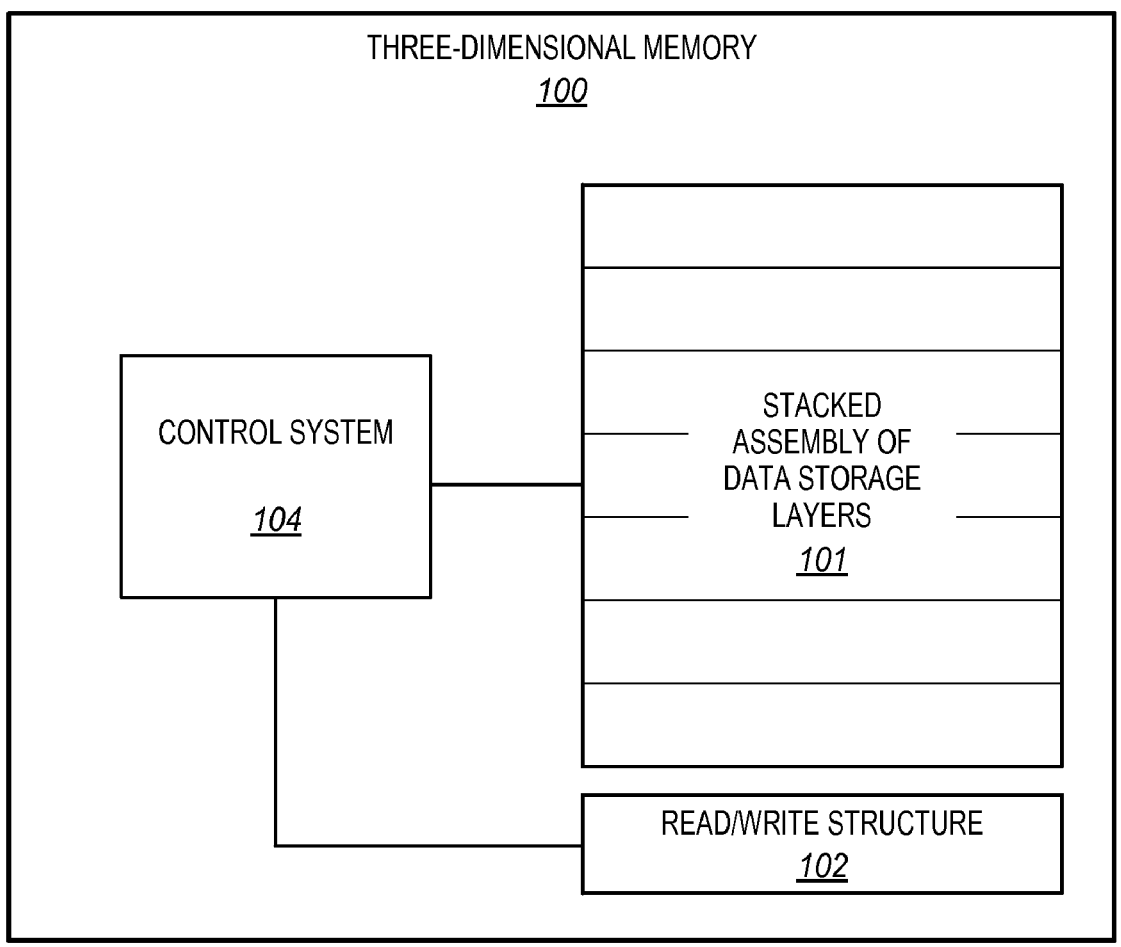
FIG. 1 illustrates a three-dimensional memory in an exemplary embodiment.

FIG. 1 illustrates a three-dimensional memory 100 in an exemplary embodiment. Memory 100 includes a stacked assembly of data storage layers 101, a read/write structure 102, and a control system 104. As will be further illustrated in FIG. 2, the stacked assembly 101 includes a plurality of data storage layers that are stacked on top of one another. Each of the data storage layers is able to store bits of data either persistently or temporarily in the form of magnetic domains that are imprinted into the data storage layers. A magnetic domain comprises a region of magnetization surrounded by regions of a different magnetization (or background magnetization). Magnetic domains may also be referred to herein as regions of magnetization or magnetic imprints. The magnetic domains are imprinted in locations that are referred to as domain sites, pinning sites, or memory cell sites. Read/write structure 102 includes write elements that are operable to write to a data storage layer in the stacked assembly 101, and also includes read elements that are operable to read from a data storage layer (the same layer or a different layer) in the stacked assembly 101. Control system 104 is operable to control how bits are written to a data storage layer in the stacked assembly 101, and how bits are read from a data storage layer. Control system 104 is also operable to control how bits are transferred within a data storage layer, and between the data storage layers in the stacked assembly 101.

Although one stacked assembly 101 is shown in FIG. 1, memory 100 may include a plurality of stacked assemblies. For instance, if the stacked assembly 101 shown in FIG. 1 provides 4 Mbits of storage, then memory 100 may include a plurality of stacked assemblies 101 as shown in FIG. 1 to provide 16 Mbits, 32 Mbits, 64 Mbits, etc.

Figure 2:
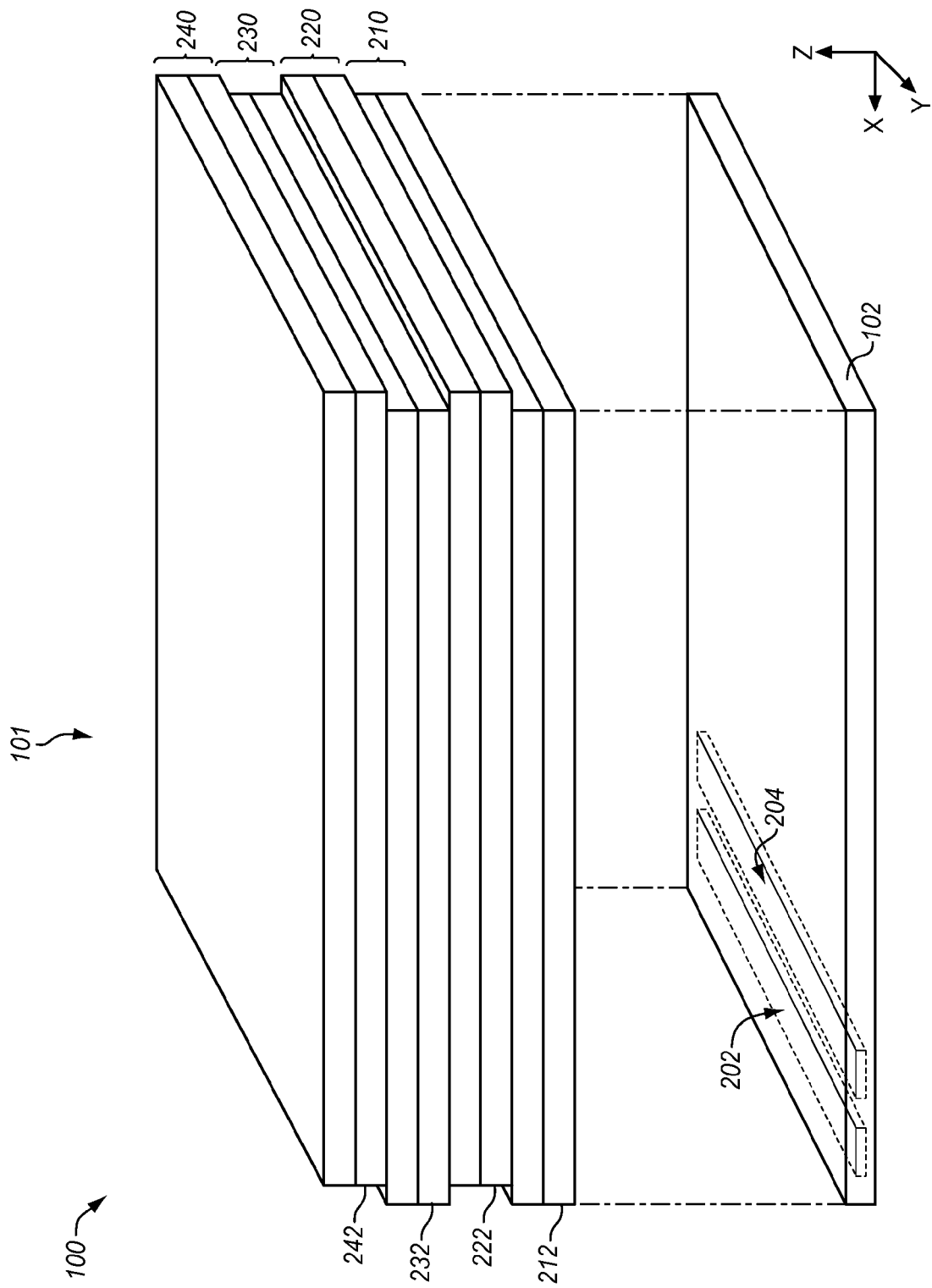
FIG. 2 is an isometric view of the three-dimensional memory in an exemplary embodiment.

FIG. 2 is an isometric view of memory 100 in an exemplary embodiment. The view in FIG. 2 only shows a portion of memory 100, as an actual memory may extend further in the X, Y, or Z direction. In memory 100, stacked assembly 101 includes a plurality of individual storage stacks, such as a first storage stack 210, a second storage stack 220, a third storage stack 230, and a fourth storage stack 240. Storage stack 210 is proximate to storage stack 220, storage stack 220 is proximate to storage stack 230, and storage stack 230 is proximate to storage stack 240. Being proximate means that one stack is adjacent to or adjoining another stack. There may be more or less storage stacks in stacked assembly 101 that are not illustrated in this embodiment. For instance, memory 100 may include a fifth storage stack, a sixth storage stack, etc.

Storage stacks 210-240 are illustrated as multi-layer stacks. Each multi-layer stack may include any subset of layers operable to store bits of data. At a minimum, each storage stack includes a data storage layer that is operable to store bits of data in the form of magnetic domains. For example, storage stack 210 includes data storage layer 212, storage stack 220 includes data storage layer 222, storage stack 230 includes data storage layer 232, and storage stack 240 includes data storage layer 242. Each of the storage stacks 210-240 may further include an insulating layer. The insulating layer is operable to insulate the data storage layer from other data storage layers when it is heated.

Storage stacks 210-240 are arranged in the Z-direction to form substantially parallel planes, as is evident in FIG. 2. For example, storage stack 210 defines a first plane in the X-Y direction. Storage stack 220 defines a second plane in the X-Y direction that is substantially parallel to the first plane. Storage stack 230 defines a third plane in the X-Y direction, and storage stack 240 defines a fourth plane in the X-Y direction.

In FIG. 2, read/write structure 102 (or read/write layer 102) is fabricated proximate to storage stack 210. Read/write structure 102 includes a column 202 of write elements (also referred to as a write column) and a column 204 of read elements (also referred to as a read column). Prior read/write structures that were suggested for a three-dimensional memory included an array of write elements that are able to write a page of bits simultaneously to a data storage layer, and an array of read elements that are able to read a page of bits simultaneously from a data storage layer. However, in this embodiment the read/write structure 102 includes a single column 202 of write elements that are operable to write a column of bits to storage stack 210 (or to data storage layer 212). Write column 202 may thus include a plurality of write elements that are fabricated in a line within read/write structure 102. Read/write structure 102 may further include a single column 204 of read elements that are operable to read a column of bits from storage stack 210 (or from data storage layer 212). Read column 204 may thus include a plurality of read elements that are fabricated in a line within read/write structure 102. Although the term "column" is used herein, the write elements and read elements may also be considered as being fabricated in a "row" or a "line".

Columns 202 and 204 are shown in FIG. 2 as being fabricated side by side in this embodiment. However, this is just an example to show that the write elements and the read elements may be each fabricated into single columns. Memory designers may choose to fabricate columns 202 and 204 virtually anywhere within read/write structure 102. For example, columns 202 and 204 may be fabricated on opposite ends of read/write structure 102. In another embodiment, column 202 may be stacked on top of column 204, or vice-versa. In yet another embodiment, write elements of column 202 and read elements of column 204 may be fabricated integrally in a single column. Columns 202 and 204 may even be fabricated on opposite ends of the stacked assembly 101.

Also, there may be embodiments where the write elements are fabricated into more than one column 202 within read/write structure 102, however not a full array of write elements. As will be explained further below, a column of magnetic domains is written into data storage layer 212, and then transferred laterally within the data storage layer 212. Thus, memory designers may fabricate two columns 202 of write elements, three columns 202, four columns 202, etc, and then transfer the multiple columns of magnetic domains laterally within data storage layer 212. What should be understood is that a full or large array of write elements is not used to write to the entire data storage layer 212 simultaneously, as the magnetic domains could not be transferred laterally within the data storage layer 212 as is desired in the embodiments herein and the fabrication complexity and cost would increase substantially.

Additionally, there may be embodiments where the read elements are fabricated into more than one column 204 within read/write structure 102, however not a full array of read elements. Memory designers may fabricate two columns 204 of read elements, three columns 204, four columns 204, etc, as desired for an acceptable read operation speed. What should be understood is that a full or large array of read elements is not used in some embodiments to read from the entire data storage layer 212 simultaneously.

Figure 3:
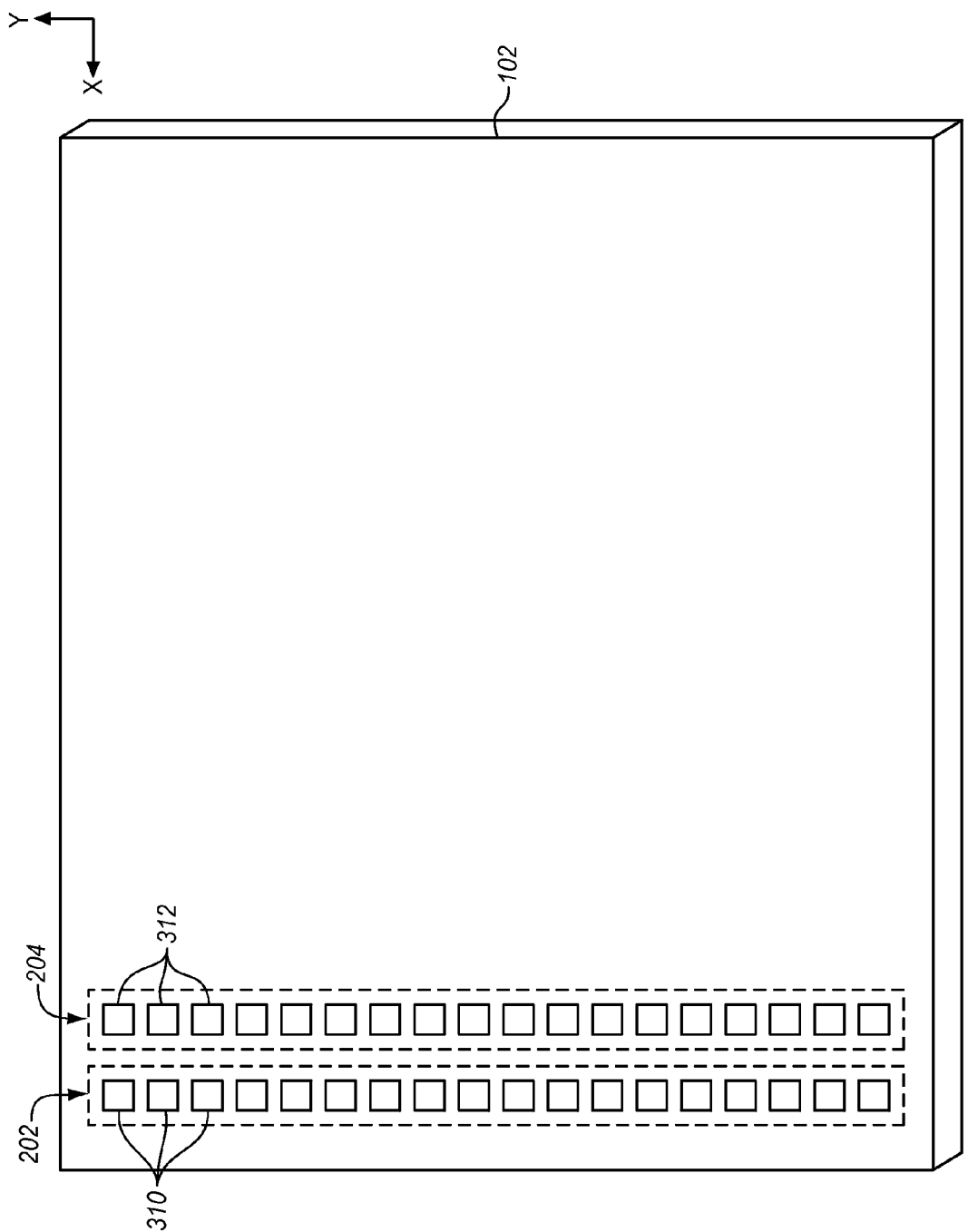
FIG. 3 is a top view of a read/write structure in an exemplary embodiment.

FIG. 3 is a top view of read/write structure 102 in an exemplary embodiment. FIG. 3 only illustrates a portion of read/write structure 102, as read/write structure 102 is actually much larger so that the memory 100 can store kilo-bytes or mega-bytes of data. Write column 202 in FIG. 3 includes a plurality of write elements 310. Write elements 310 comprise any elements or structures that are operable to induce or imprint magnetic domains (representing bits of data) in a data storage layer (e.g., data storage layer 212 in FIG. 2).

Read column 204 in FIG. 3 includes a plurality of read elements 312. Read elements 312 comprise any elements or structures that are operable to sense magnetic fields from magnetic domains in a data storage layer (e.g., data storage layer 212 in FIG. 2). For example, read elements 312 may comprise spin valve sensors, tunnel valve sensors, or another type of magnetoresistance (MR) sensors.

Figure 4:
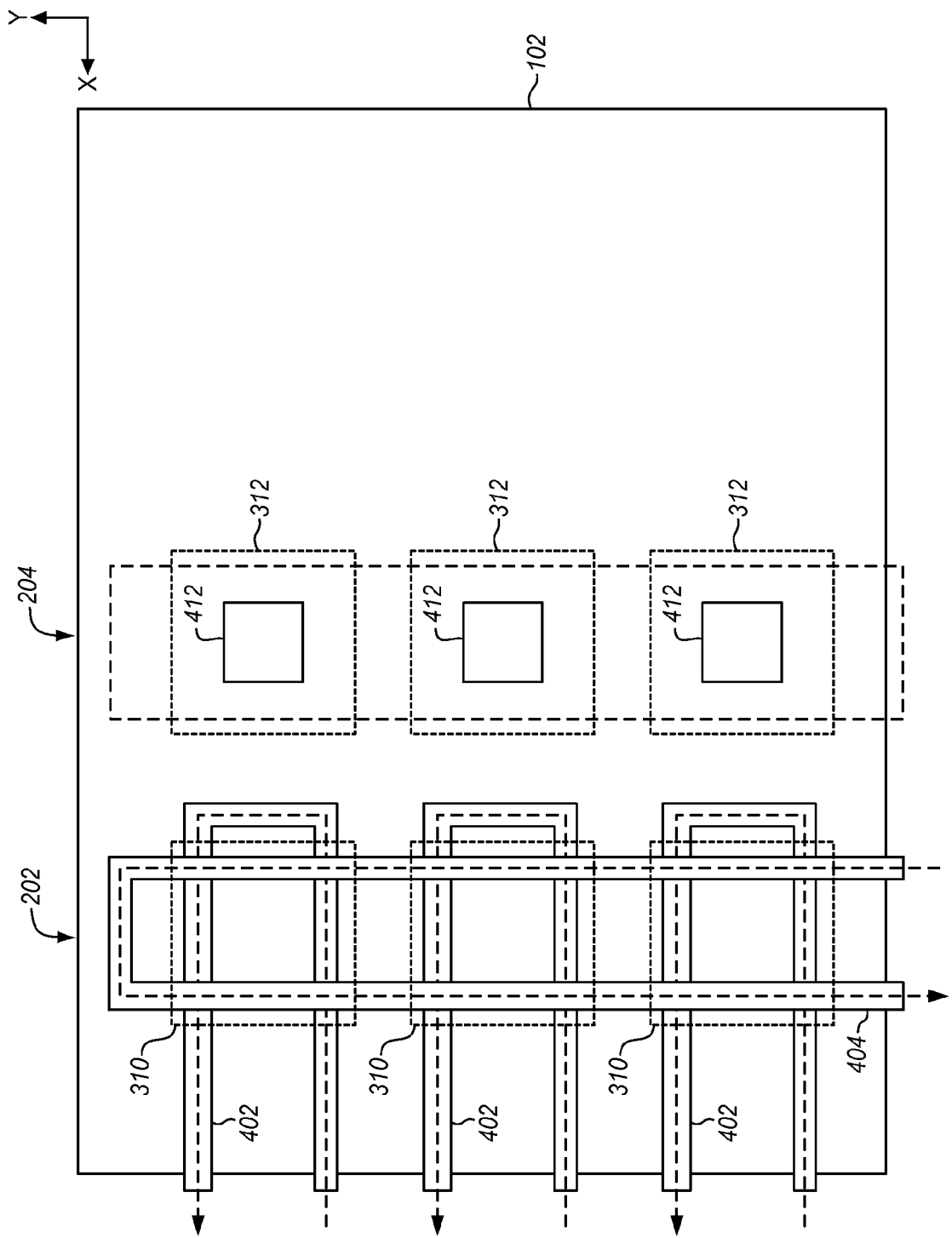
FIG. 4 is another top view of a read/write structure in an exemplary embodiment.

FIG. 4 is another top view of read/write structure 102 in an exemplary embodiment. FIG. 4 shows a close up view of write column 202 and read column 204 in one particular embodiment, but read/write structure 102 is not limited to the implementation shown in FIG. 4. In this embodiment, the write elements 310 in write column 202 are formed from current loops. More particularly, write column 202 includes a plurality of current loops 402 formed parallel to one another. Each of the current loops 402 surrounds a domain site in write column 202. Write column 202 also includes a current loop 404 that is orthogonal to current loops 402. Current loop 404 extends the length of write column 202 and "intersects" current loops 402 at the domain sites in column 202. Current loop 404 is fabricated on a different plane than current loops 402, so the current loops do not physically intersect. But when viewed from above, current loop 404 crosses over current loop 402. The locations where current loop 404 "intersects" current loops 402 represent write elements 310. The current loops 402 and 404 may be connected to the control system 104 (see FIG. 1) for writing magnetic domains into a data storage layer. For example, if control system 104 injects a current into the top-most current loop 402 and into current loop 404, then a magnetic field is generated that is pointing out of the page in FIG. 4. This magnetic field is able to imprint a magnetic domain in data storage layer 212 (see FIG. 2), which writes a bit into data storage layer 212.

Read elements 312 in read column 204 include MR sensors 412. To read from a data storage layer, control system 104 (see FIG. 1) may pass a sense current through each of the MR sensors 412. The magnetic domains in the data storage layer will affect the magnetization of the MR sensors 412, which in turn affects the resistance of the MR sensors 412. By passing the sense current through MR sensors 412, control system 104 may measure the resistance of the MR sensors 412. A first resistance R1 of a MR sensor 412 indicates the existence of a magnetic domain in the data storage layer, and a bit having a value of "1". A second resistance R2 of a MR sensor 412 indicates the absence of a magnetic domain in the data storage layer, and a bit having a value of "0".

Figure 5:
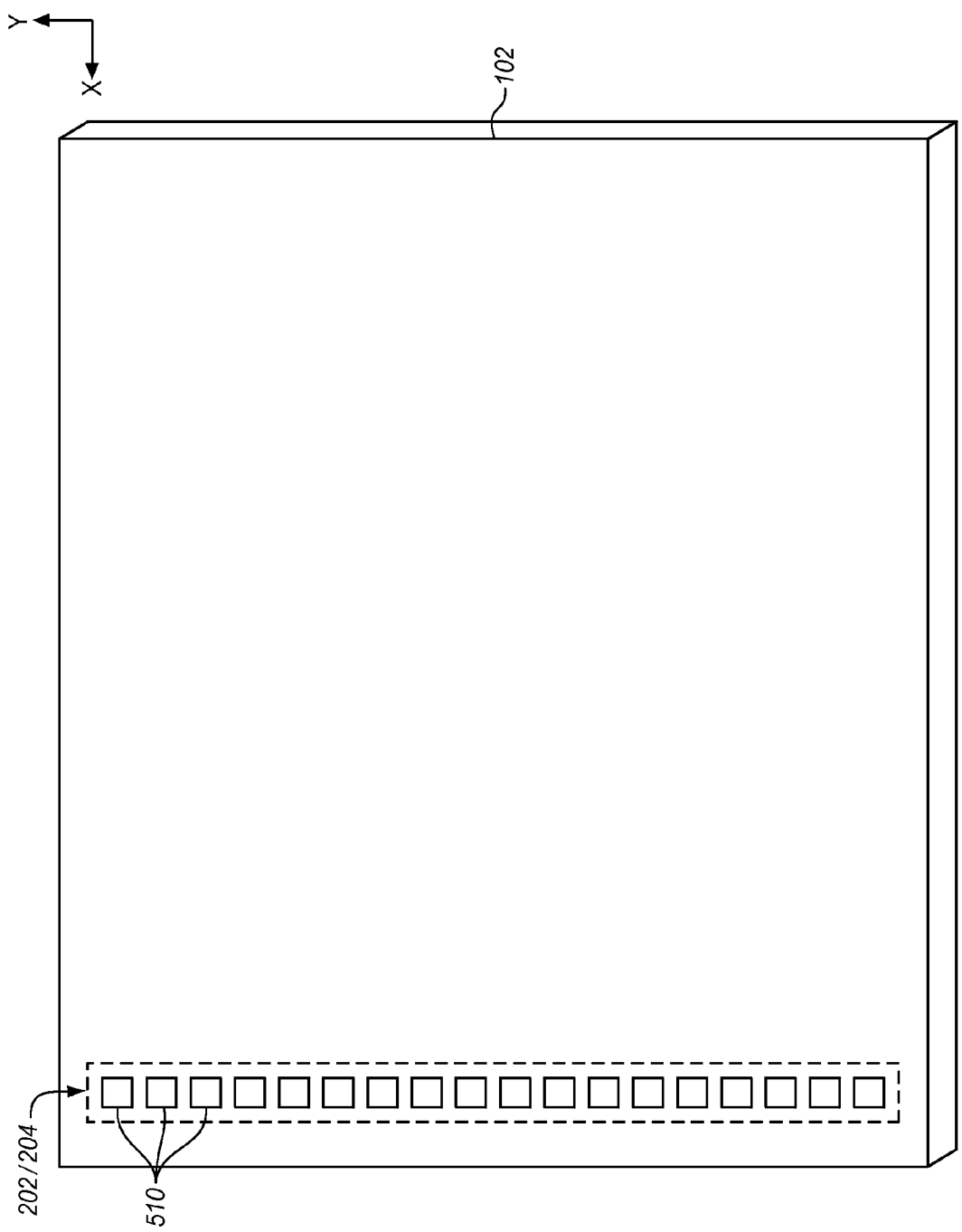
FIG. 5 is a top view of a read/write structure in another exemplary embodiment.

In another embodiment, the write elements of column 202 and the read elements of column 204 may be fabricated integrally in a single column 202/204, which is shown in FIG. 5. FIG. 5 is a top view of read/write structure 102 in another exemplary embodiment. FIG. 5 only illustrates a portion of read/write structure 102, as read/write structure 102 is actually much larger so that the memory 100 can store kilo-bytes or mega-bytes of data. In this embodiment, write column 202 and read column 204 are integrated into a single column 202/204. Read/write column 202/204 in FIG. 5 includes a plurality of write elements integrated with a plurality of read elements, referred to as read/write elements 510.

Figure 6:
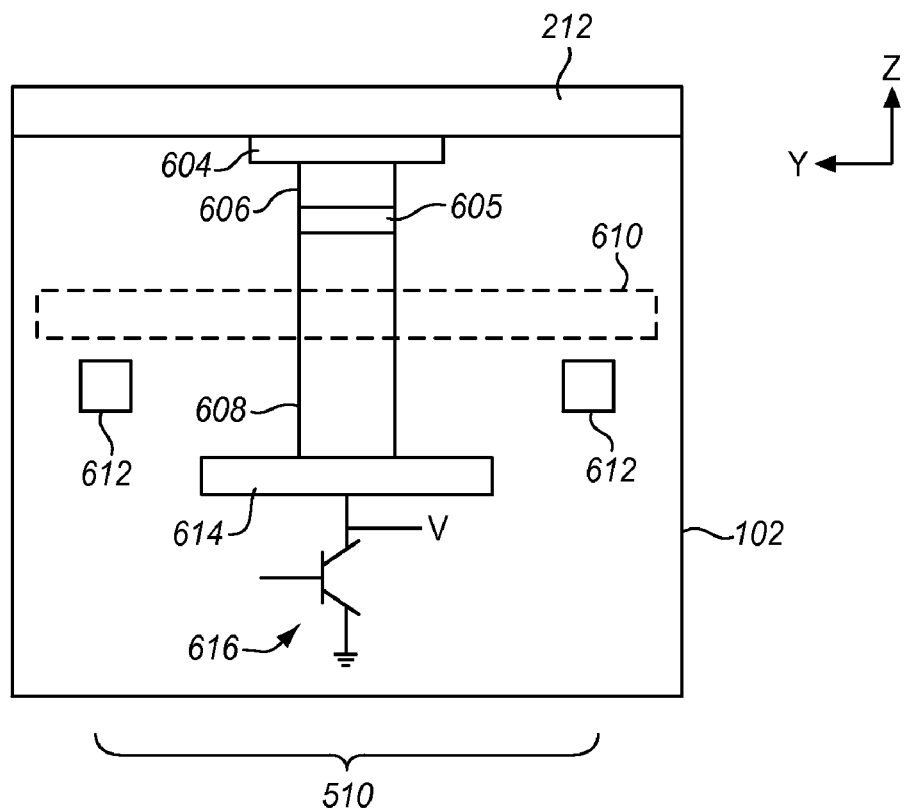
FIG. 6 is a cross-sectional view of a read/write element in an exemplary embodiment.

FIG. 6 is a cross-sectional view of a read/write element 510 in an exemplary embodiment. The read portion of read/write element 510 includes a read conductor 604, a flux cap 606, and a read sensor 605. Read conductor 604 is fabricated proximate to data storage layer 212 in this embodiment. The read conductor 604 connects to control system 104 so that control system 104 may selectively apply a voltage to read conductor 604. Flux cap 606 is comprised of a magnetic material, and connects a read conductor 604 to a read sensor 605 in read/write element 510. Read sensor 605 comprises any element operable to sense magnetic fields from magnetic domains that represent bits stored in data storage layer 212. For example, read sensor 605 may comprise a spin valve sensor, a tunnel valve sensor, or another type of magnetoresistance (MR) sensor. The MR sensor may be comprised of free layers and pinned (reference) layers having longitudinal or perpendicular anisotropy. Typical materials having perpendicular anisotropy include Co/Ni, Co/Pt, or Co/Pd. If read sensor 605 is an MR sensor, then magnetic domains stored in data storage layer 212 affect the resistance of the sensor, which may be detected by passing a sense current through the sensor.

The write portion of the read/write element 510 includes a magnetic pole 608, first write conductors 610 fabricated between the magnetic poles 608, and second write conductors 612 fabricated between the magnetic poles 608 orthogonal to the first write conductors 610. The first write conductors 610 in FIG. 6 are parallel to the page and are illustrated as dotted lines as these conductors 610 are in between the magnetic poles 608. The second write conductors 612 in FIG. 6 are perpendicular to the page. The first write conductors 610 and the second write conductors 612 form current loops surrounding the magnetic poles 608. The write conductors 610 and 612 connect to control system 104 so that control system 104 may selectively inject a current through the appropriate write conductors 610 and 612. The current in a current loop generates a magnetic field in the write pole 608 which is used to imprint a magnetic domain into storage stack 210.

Magnetic poles 608 also connect to magnetic pedestal 614, which is in turn connected to a transistor 616. Transistor 616 is used in read operations, and is also connected to control system 104. For example, transistor 616 may comprise a MOSFET having a source that connects to magnetic pedestal 614. Although a transistor is illustrated in FIG. 6, those skilled in the art will appreciate that other types of switching elements may be used in other embodiments.

The read/write elements 510 in FIG. 5 may alternatively comprise spin-torque devices where current is passed through a hard magnetic layer and into a data storage layer. The hard magnetic layer serves to spin polarize the electrons such that they can then reverse a region (or bit) of the data storage layer.

Figure 7:
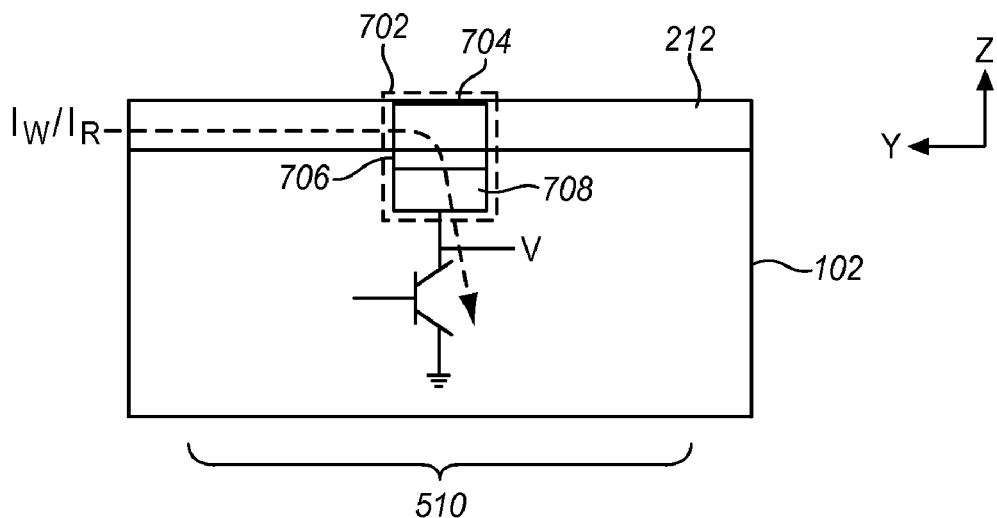
FIG. 7 is a cross-sectional view of another read/write element in an exemplary embodiment.

FIG. 7 is a cross-sectional view of another read/write element 510 in an exemplary embodiment. Read/write element 510 in this embodiment comprises a spin-torque device. The spin torque device comprises an MR device 702, such as a GMR or TMR device. MR device 702 includes a free layer 704, a spacer/barrier layer 706, and a pinned layer or reference layer 708. Free layer 704 is implemented as part of data storage layer 212.

MR device 702 may be used as a writer as follows. When a high density current (Iw) flows from free layer 704 to reference layer 708, the electrons during their transit in reference layer 708 get polarized in the direction of the reference layer magnetization. The electrons preserve their polarization as they flow through spacer/barrier layer 706, which is a very thin metal spacer such as Cu or an ultrathin tunnel barrier such as MgO. When the electrons impinge upon free layer 704, a mutual spin torque develops that destabilizes the free layer magnetization. If the torque is strong enough, this interaction causes the free layer magnetization to reverse to be parallel to the spin polarization direction (i.e., reference layer). For example, the free layer magnetization may transition from antiparallel to parallel. If the free layer magnetization was parallel to start, then nothing happens. Thus, the high density current may be used to write different magnetic domains into free layer 704, which writes a magnetic domain into data storage layer 212.

MR device 702 may be used as a reader as follows. The free layer magnetization may be sensed through the GMR/TMR effects by applying a very small sense current (Ir) to probe the resistance. The current flow scheme is the same as for writing, but the current applied is too small such that the spin torque is not strong enough to cause any disturbance to the free layer magnetization. Thus, the magnetic domain that is present in the free layer is sensed through the sense current.

Because a column of bits are written into data storage layer 212, the column of bits have to be transferred either laterally within data storage layer 212, or upward in stacked assembly 101 (see FIG. 2). The structure of data storage layer 212 allows the column of bits to be transferred laterally, which is further illustrated in FIG. 8.

Figure 8:
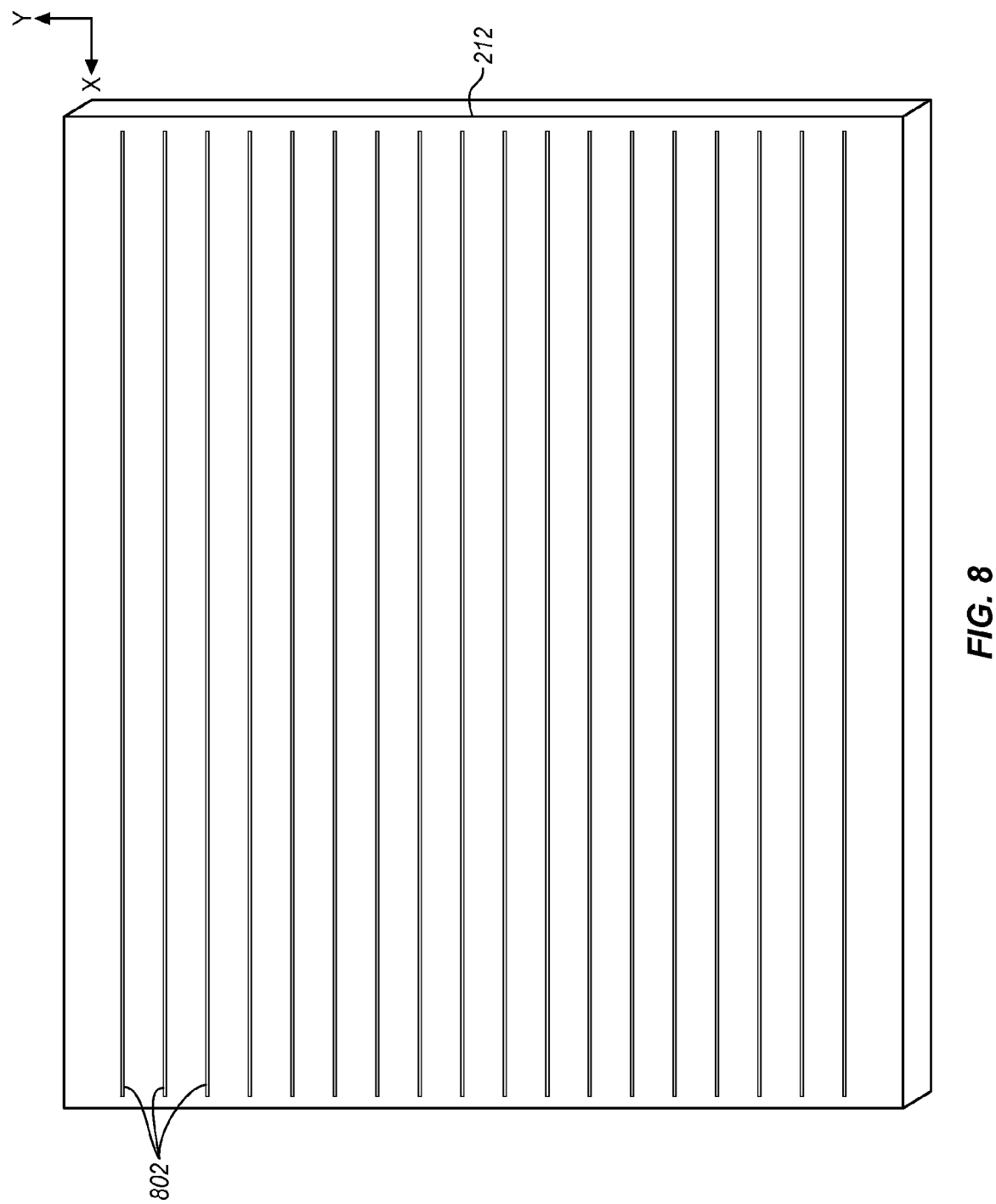
FIG. 8 is an isometric view of a data storage layer in an exemplary embodiment.

FIG. 8 is an isometric view of data storage layer 212 in an exemplary embodiment. Data storage layer 212 is comprised of a material that stores magnetic domains. For example, data storage layer 212 may be formed from a perpendicular media type, such as TbFeCo or CoPt multi-layers with a typical Mr in the 300-500 emu/cc range. Data storage layer 212 is patterned into a plurality of magnetic conductors 802 that run transverse or perpendicular to the write column 202 (see FIG. 3). For example, the write column 202 is in the Y direction while the magnetic conductors 802 are patterned in the X-direction. Magnetic conductors 802 are operable to transfer a column of magnetic domains (i.e., a column of bits) that is written into layer 212 laterally within layer 212 (i.e., from left to right in FIG. 8 or vice versa). The areas between magnetic conductors 802 may be formed from an insulating material or some other material.

As an example, assume that magnetic conductors 802 are connected to control system 104 (see FIG. 1). If a column of magnetic domains is written into data storage layer 212, then control system 104 may inject spin-polarized current pulses into magnetic conductors 802. The spin-polarized current pulses can move the magnetic domains laterally (i.e., in the X direction) along magnetic conductors 802 in the direction of electron drift due to the transfer of transverse angular momentum from the spin-polarized current. This is also referred to as spin torque transfer. Other data storage layers 222, 232, and 242 may have a similar structure to data storage layer 212. However, for each successive layer, the magnetic conductors may be turned perpendicular to the preceding layer. For example, if data storage layer 222 was illustrated on top of data storage layer 212 in FIG. 8, then the magnetic conductors in data storage layer 222 may be perpendicular to the magnetic conductors 802 in data storage layer 212.

Figure 9:
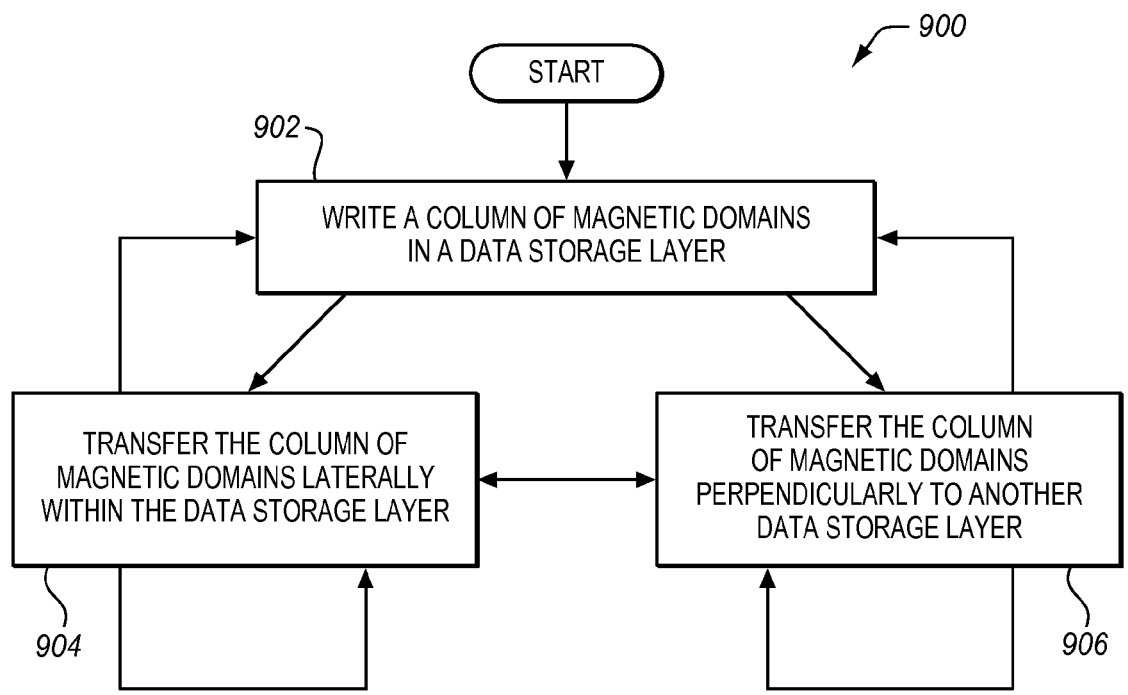
FIG. 9 is a flow chart illustrating a method of writing bits of data in the three-dimensional memory in an exemplary embodiment.

FIG. 9 is a flow chart illustrating a method 900 of writing bits of data in memory 100 in an exemplary embodiment. The steps of method 900 will be described with reference to memory 100 in FIGS. 1-8. Also, the steps of the flow charts provided herein are not all inclusive and other steps, not shown, may be included. Further, the steps may be performed in an alternative order.

Figure 10:
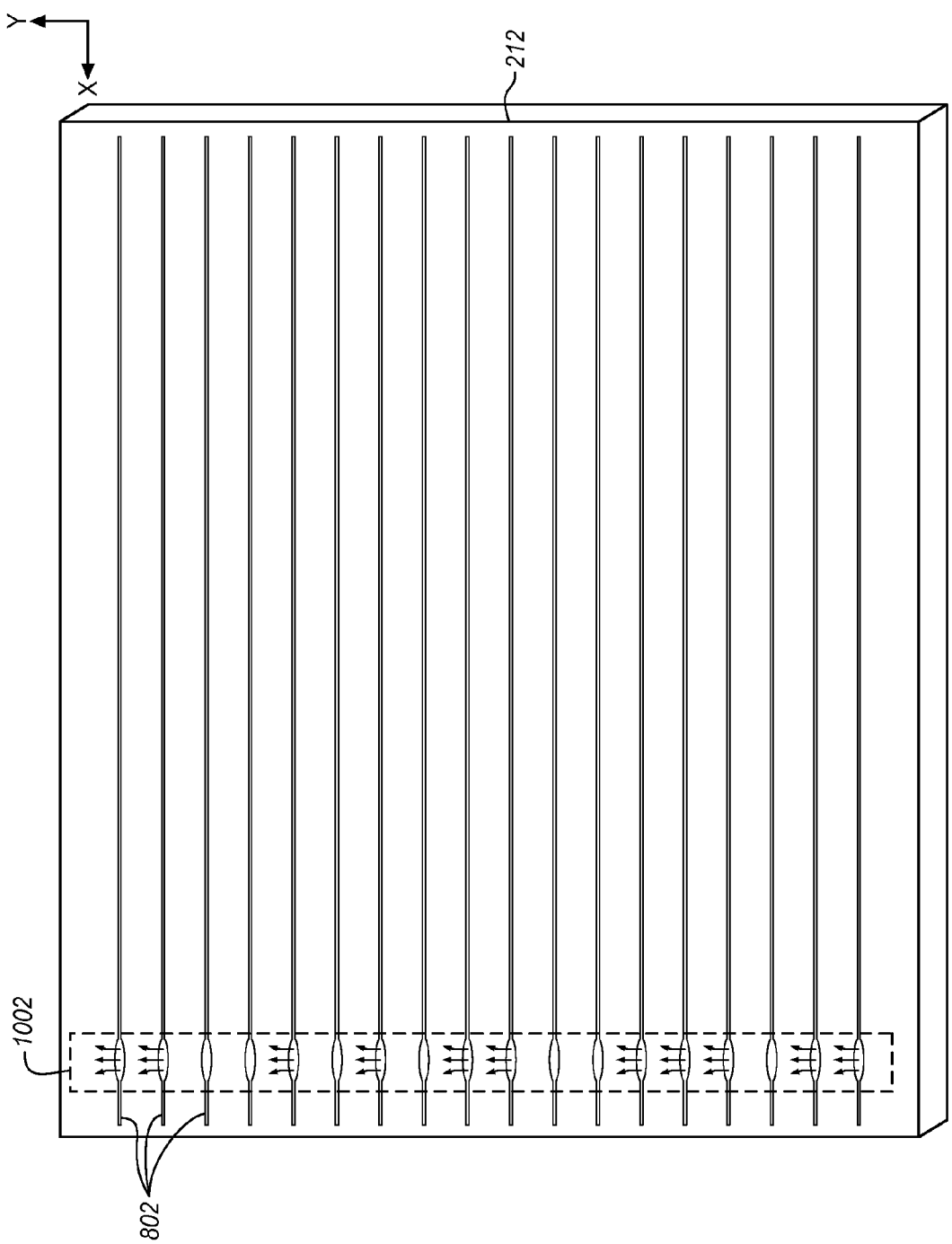
FIG. 10 illustrates a column of magnetic domains written into a data storage layer in an exemplary embodiment.

In step 902, control system 104 controls the write elements 310, 510 in column 202 to write a column of magnetic domains in data storage layer 212. Stated another way, write elements 310, 510 write a column of bits in data storage layer 212 in the form of magnetic domains. FIG. 10 illustrates a column of magnetic domains written into data storage layer 212 in an exemplary embodiment. Data storage layer 212, or more particularly, the magnetic conductors 802, has a background magnetization such as a magnetization perpendicular to the plane pointing downward in FIG. 10. The magnetic domains are formed by changing the magnetization locally to a polarity opposite the primary magnetization of data storage layer 212, which is illustrated by a circle with arrows pointing upward in FIG. 10. The existence of a magnetic domain magnetized opposite to the background magnetization indicates one binary value of a bit, such as a "1". The absence of an oppositely-magnetized domain in a particular region in data storage layer 212 indicates another binary value of a bit, such as a "0". The absence of a magnetic domain in FIG. 10 is illustrated as a circle with no arrows (i.e., the magnetization is the same as the background magnetization and points downward).

The column of magnetic domains is written into locations on magnetic conductors 802 corresponding with the locations of the write elements 310, 510, which is the left hand side of data storage layer 212 in FIG. 10. The location where the column of magnetic domains is written by write elements 310, 510 may be referred to as the initial write location 1002. After the column of domains is written in the initial write location 1002, control system 104 may transfer the column of magnetic domains either laterally (i.e., in the X direction) within data storage layer 212 (see step 904 in FIG. 9) or perpendicularly (i.e., in the Z direction) to another data storage layer (see step 906 in FIG. 9), such as from data storage layer 212 to data storage layer 222 (see also FIG. 2).

Figure 11:
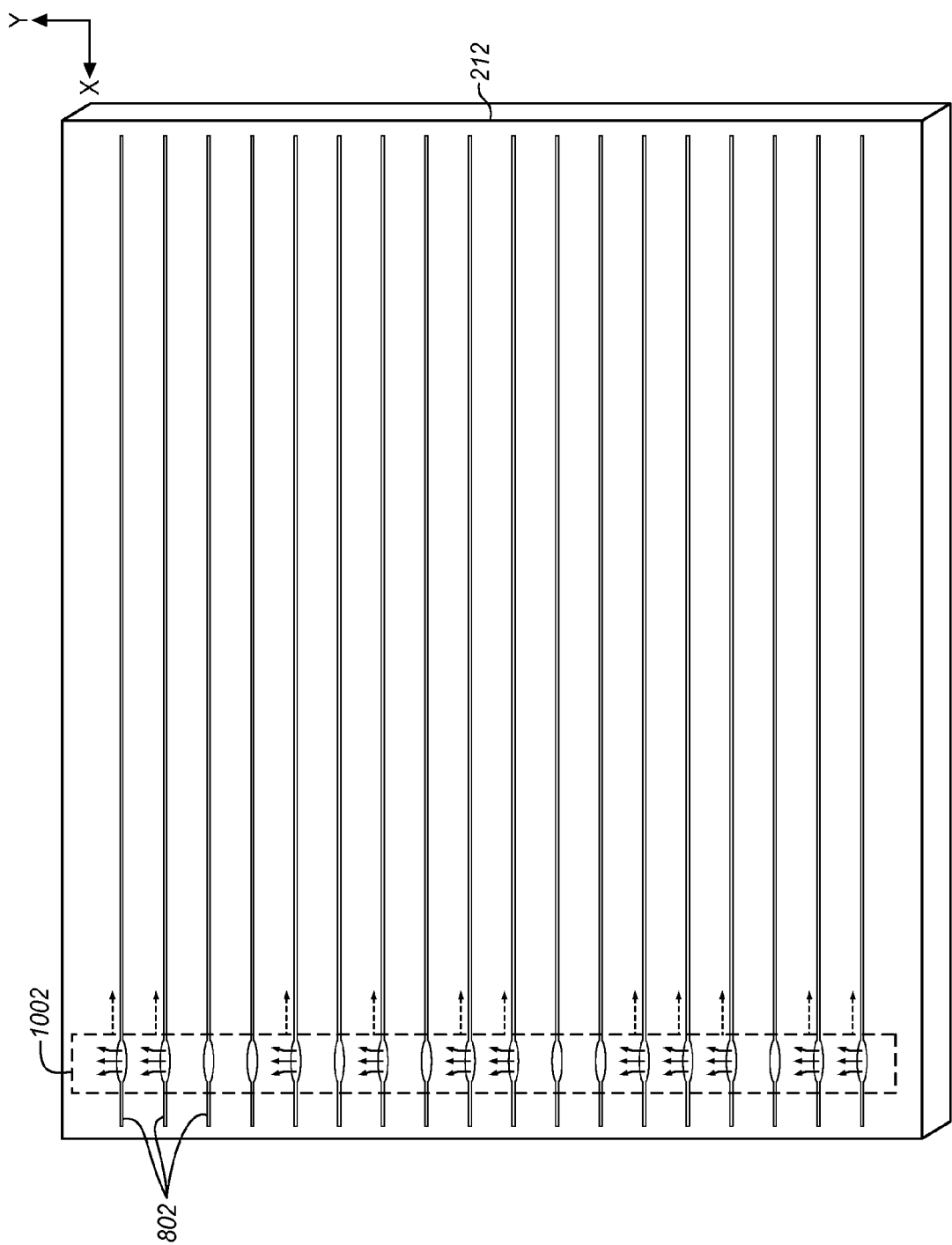
FIGS. 11-12 illustrate the column of magnetic domains transferred laterally within the data storage layer in an exemplary embodiment.
Figure 12:
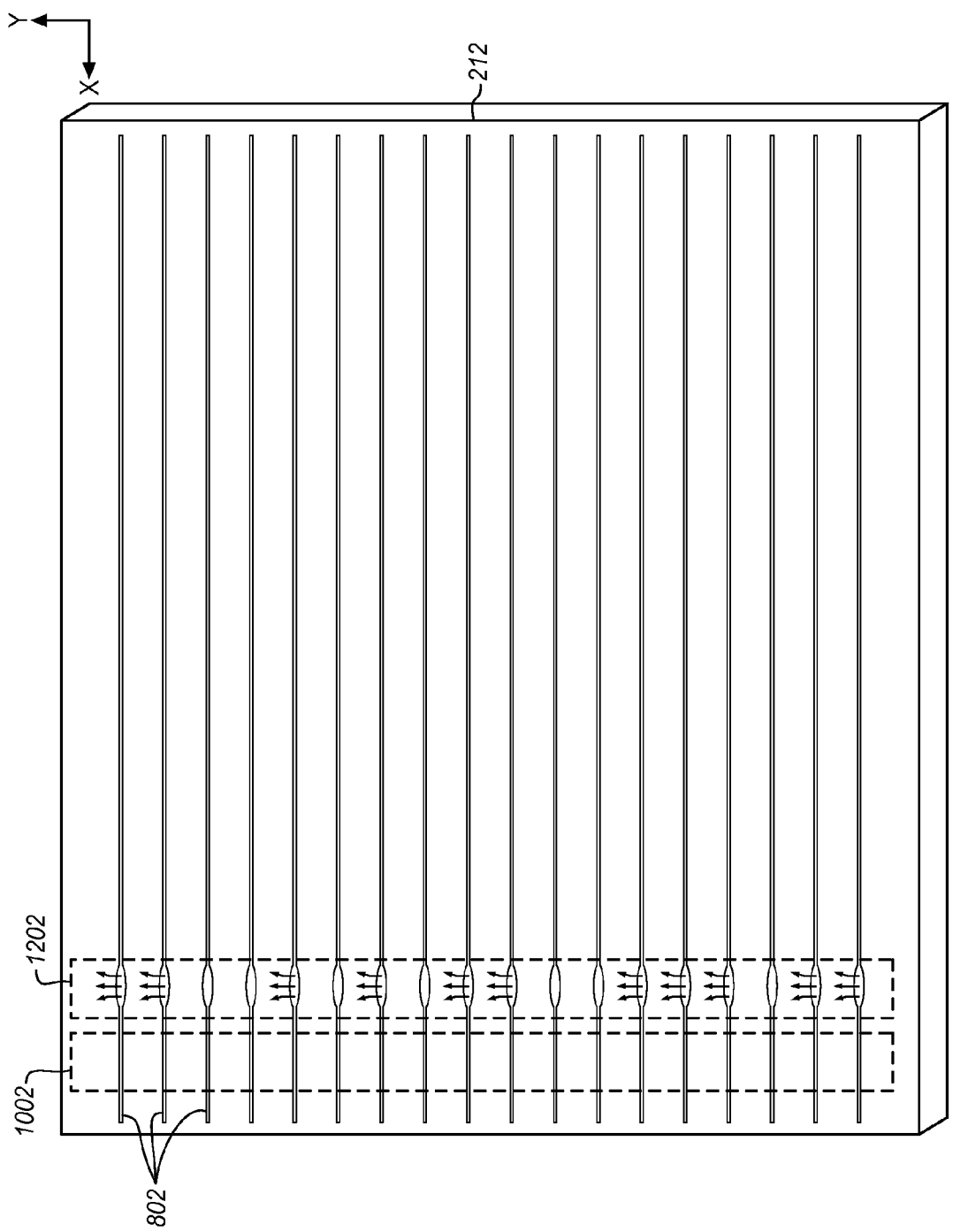

Assume in step 904 that control system 104 transfers the column of magnetic domains laterally within data storage layer 212. FIGS. 11-12 illustrate the column of magnetic domains transferred laterally within data storage layer 212 in an exemplary embodiment. In FIG. 11, to transfer the column of magnetic domains out of the initial write location 1002, control system 104 uses spin torque transfer to move the column of magnetic domains to a neighboring domain site. The neighboring domain site comprises a column of locations in data storage layer 212 that receives the column of magnetic domains as the magnetic domains drift due to spin torque transfer. For example, control system 104 may inject spin polarized current pulses into magnetic conductors 802. The spin polarized current pulses cause the column of magnetic domains to move laterally along magnetic conductors 802 in the direction of electron drift to a neighboring domain site. FIG. 12 illustrates the magnetic domains transferred from the initial write location 1002 to a neighboring domain site 1202.

After transferring the column of magnetic domains laterally within data storage layer 212 (see step 904 in FIG. 9), control system 104 may again transfer the column of magnetic domains laterally within the data storage layer 212 to yet another neighboring domain site. Control system 104 may alternatively write another column of magnetic domains in the data storage layer 212 (see step 902) or transfer the column of magnetic domains perpendicularly to another data storage layer (see step 906).

Figure 13:
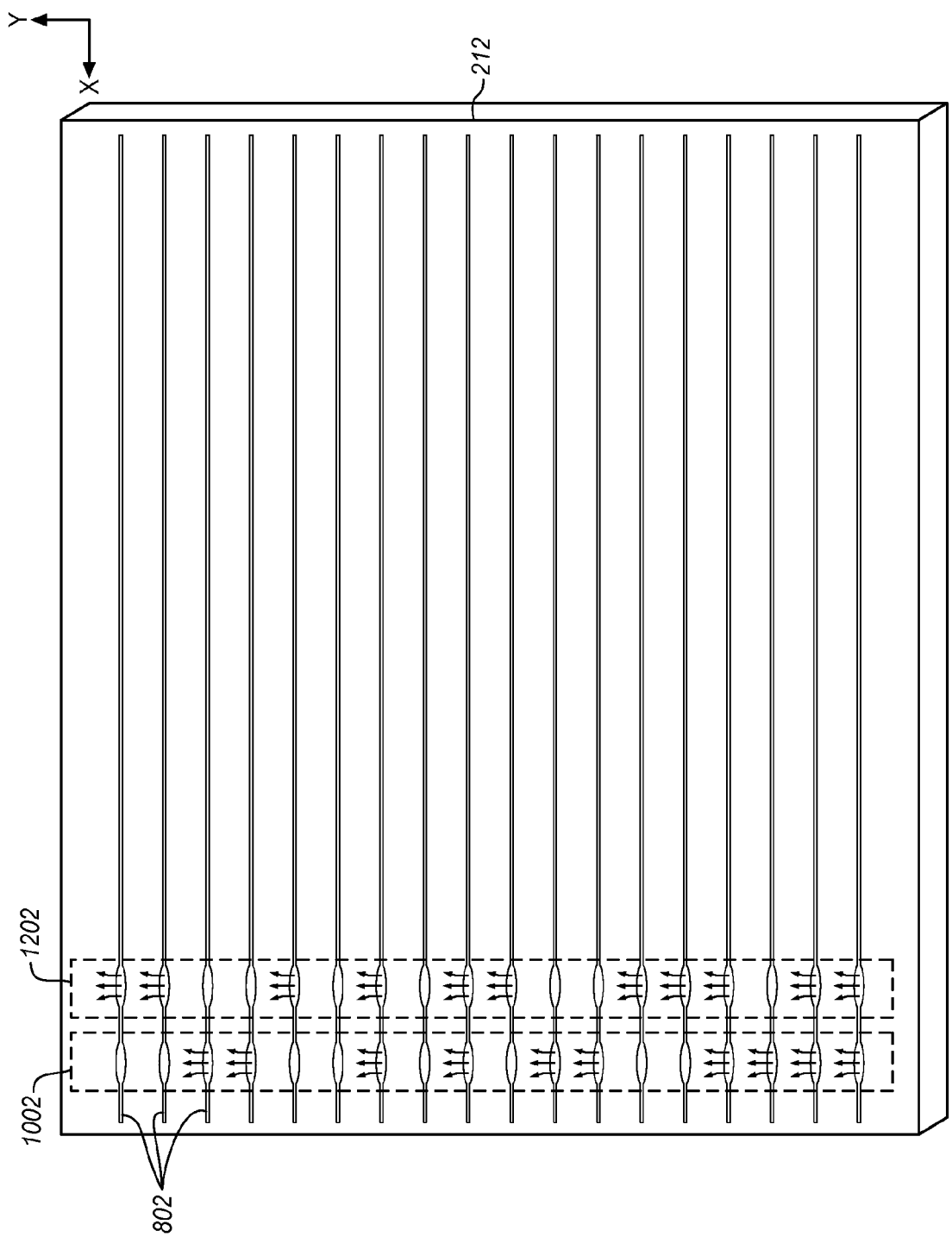
FIG. 13 illustrates another column of magnetic domains written into the data storage layer in an exemplary embodiment.

Assume for this example that control system 104 controls the write elements 310, 510 in column 202 to write another column of magnetic domains in data storage layer 212. FIG. 13 illustrates another column of magnetic domains written into data storage layer 212 in an exemplary embodiment. A new column of magnetic domains is written into the initial write location 1002. After the column of magnetic domains is written in the initial write location 1002, control system 104 may again transfer the columns of magnetic domains either laterally (i.e., in the X direction) within data storage layer 212 (see step 904 in FIG. 9) or perpendicularly (i.e., in the Z direction) to another data storage layer (see step 906 in FIG. 9).

Figure 14:
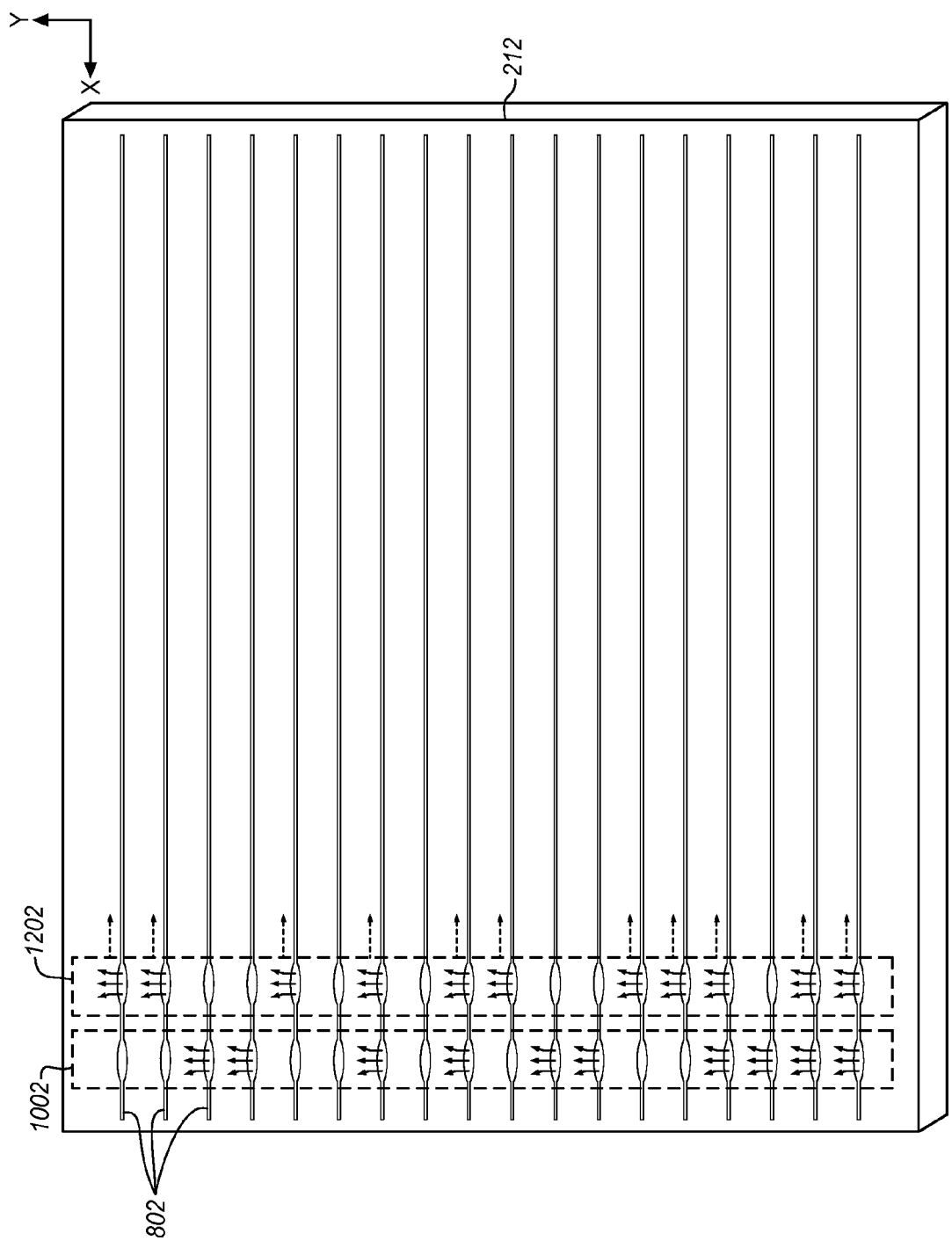
FIGS. 14-15 illustrate the column of magnetic domains transferred laterally within the data storage layer in an exemplary embodiment.
Figure 15:
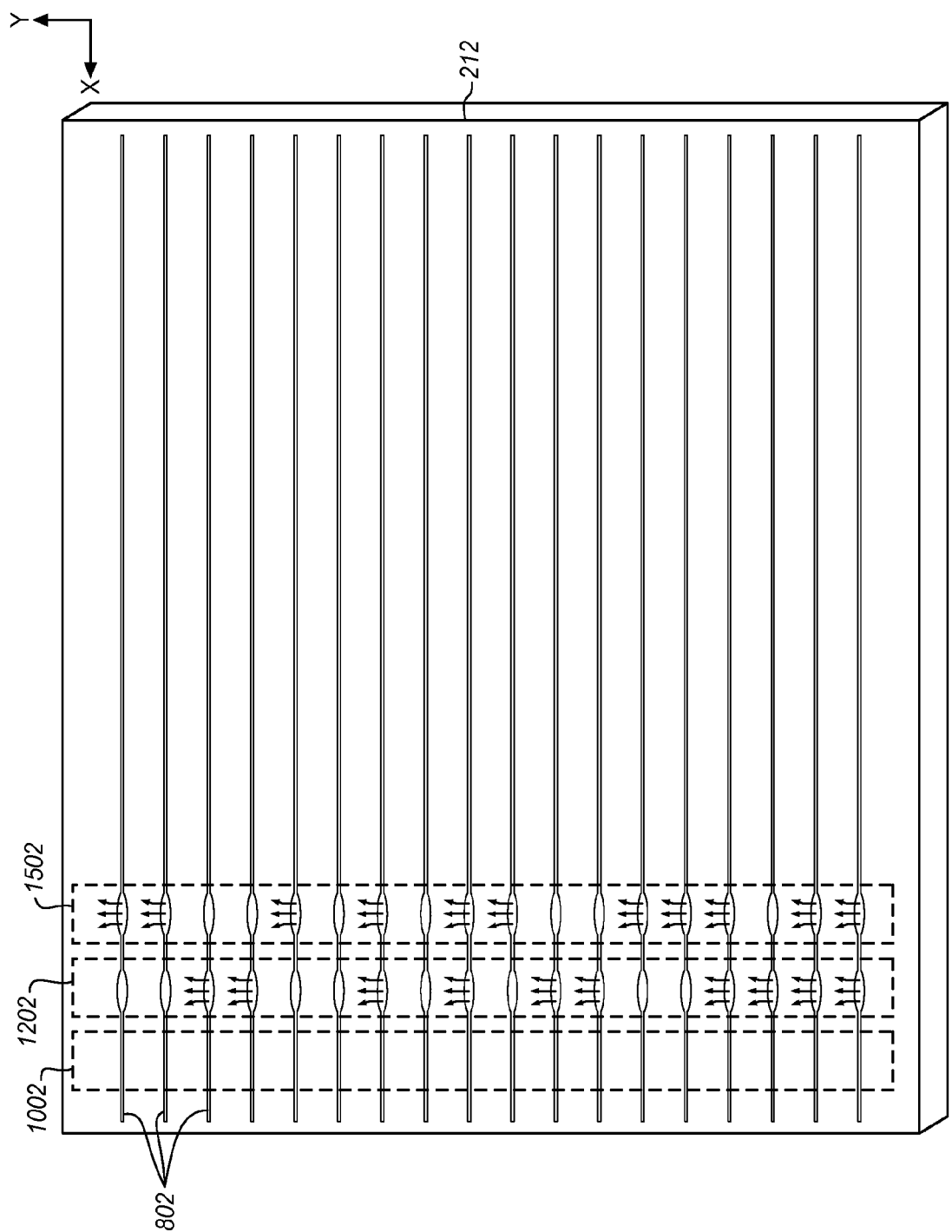

Assume in step 904 that control system 104 transfers the columns of magnetic domains laterally within data storage layer 212. In this instance, control system 104 is able to transfer both of the written columns of magnetic domains laterally within data storage layer 212. FIGS. 14-15 illustrate the columns of magnetic domains transferred again laterally within data storage layer 212 in an exemplary embodiment. In FIG. 14, to transfer the column of magnetic domains in the initial write location 1002 and the column of domains in domain site 1202, control system 104 uses spin torque transfer to move the columns of magnetic domains to neighboring domain sites. FIG. 15 illustrates the columns of magnetic domains transferred to neighboring domain sites. The neighboring domain site for the column of magnetic domains in the initial write location 1002 is domain site 1202. The neighboring domain site for the column of magnetic domains in the domain site 1202 is domain site 1502.

After transferring the columns of magnetic domains laterally within data storage layer 212 (see step 904 in FIG. 9), control system 104 may again transfer the columns of magnetic domains laterally within the data storage layer 212 to yet other neighboring domain sites. Control system 104 may alternatively write another column of magnetic domains in the data storage layer 212 (see step 902) or transfer the columns of magnetic domains perpendicularly to another data storage layer (see step 906).

Figure 16:
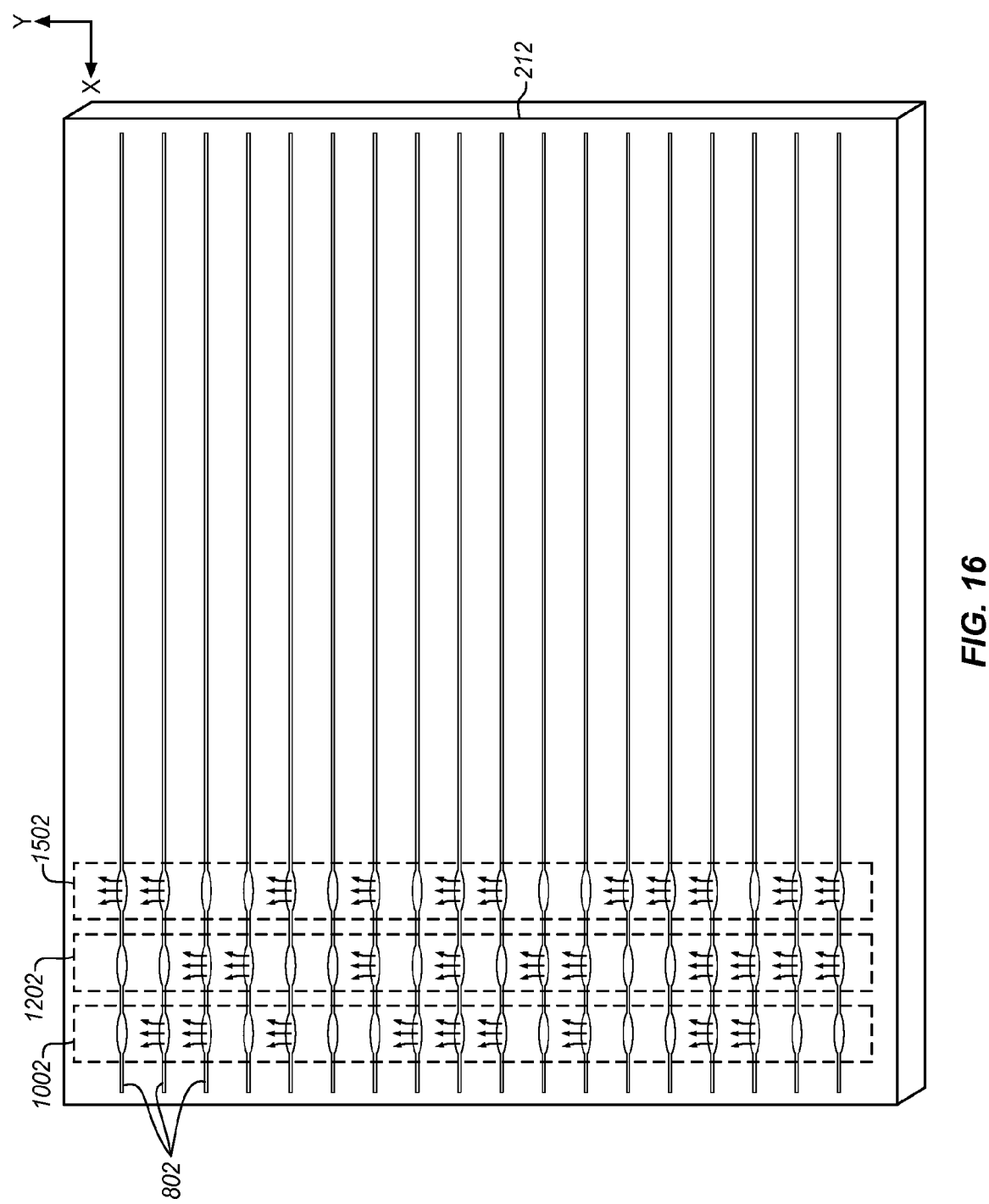
FIG. 16 illustrates yet another column of magnetic domains written into the data storage layer in an exemplary embodiment.

Assume for this example that control system 104 controls the write elements 310, 510 in column 202 to write yet another column of magnetic domains in data storage layer 212. FIG. 16 illustrates another column of magnetic domains written into data storage layer 212 in an exemplary embodiment. A new column of magnetic domains is written into the initial write location 1002. After the column of magnetic domains is written in the initial write location 1002, control system 104 may again transfer the columns of magnetic domains either laterally (i.e., in the X direction) within data storage layer 212 (see step 904 in FIG. 9) or perpendicularly (i.e., in the Z direction) to another data storage layer (see step 906 in FIG. 9).

Figure 17:
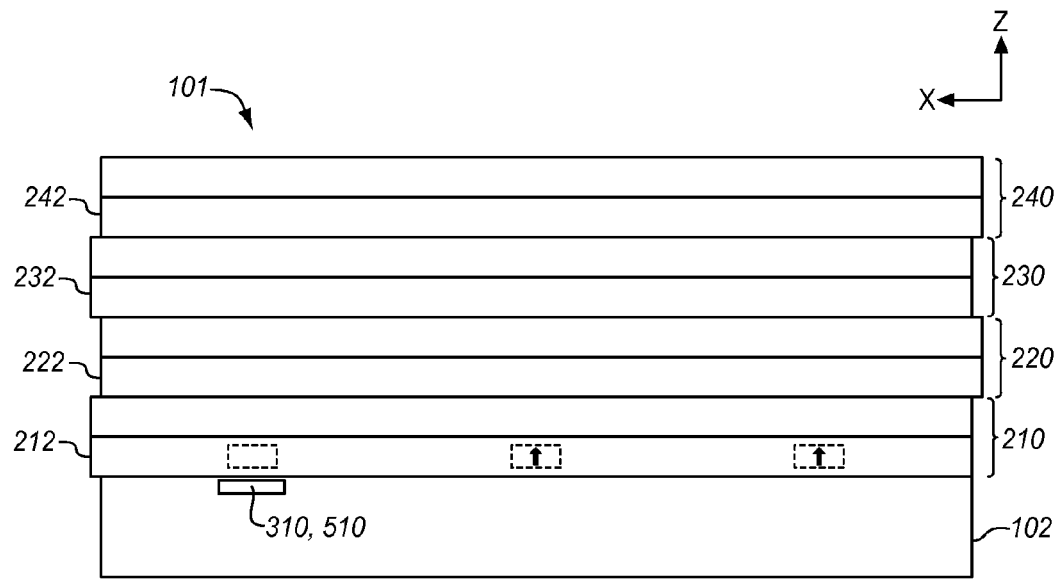
FIG. 17 is a cross-sectional view of the three-dimensional memory in an exemplary embodiment.
Figure 18:
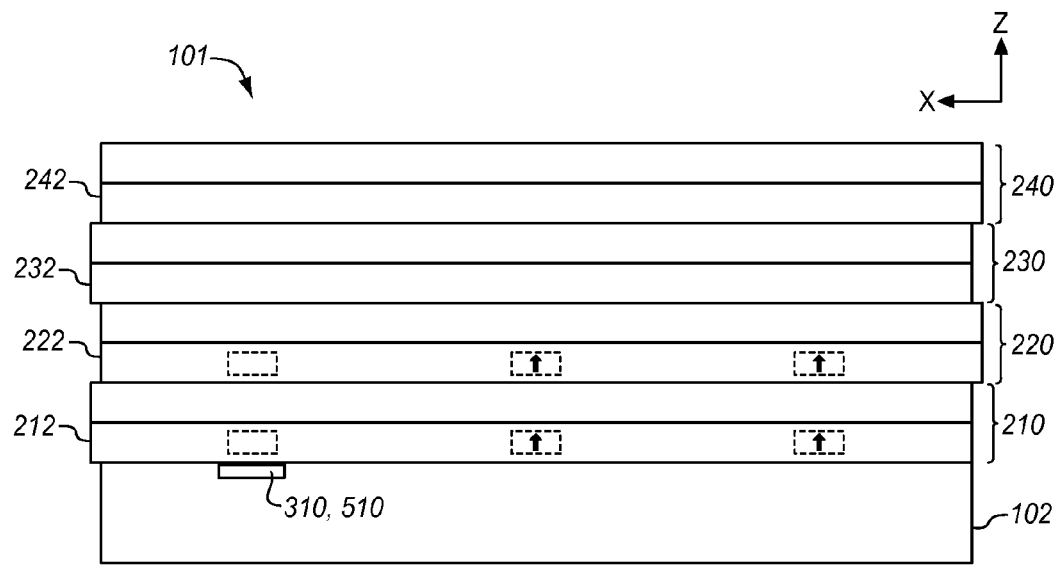
FIG. 18 is a cross-sectional view of the three-dimensional memory with the bits copied from one data storage layer to another data storage layer in an exemplary embodiment.
Figure 19:
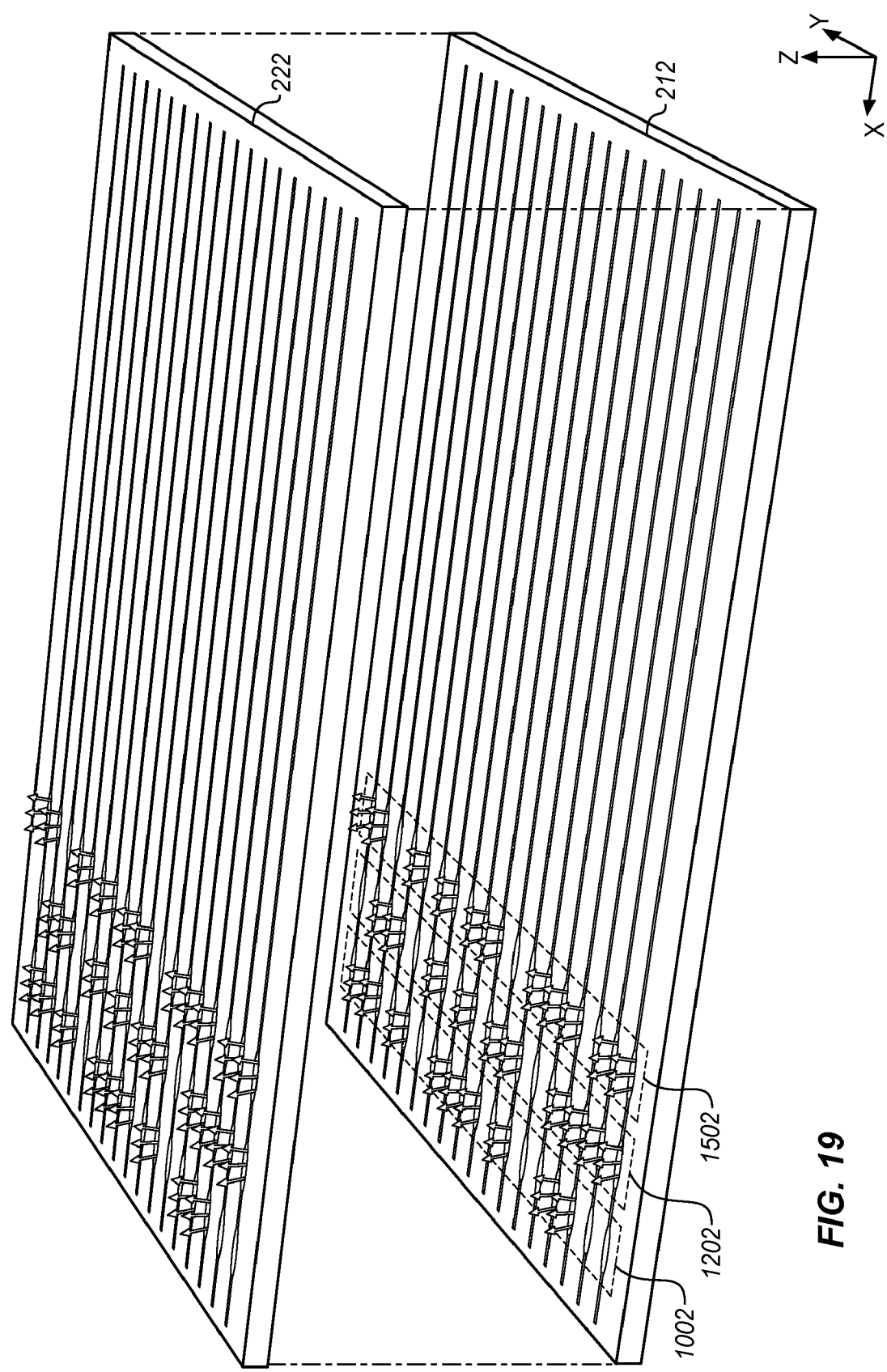
FIG. 19 is an isometric view illustrating the columns of magnetic domains transferred from one data storage layer to another data storage layer in an exemplary embodiment.

Assume in step 906 that control system 104 transfers the columns of magnetic domains perpendicularly to another data storage layer. In this instance, control system 104 is able to transfer all three of the written columns of magnetic domains perpendicularly (i.e., in the Z direction) to another data storage layer, which is illustrated in FIGS. 17-19. FIG. 17 is a cross-sectional view of memory 100 in an exemplary embodiment. FIG. 17 shows a portion data storage layer 212 that stores the columns of magnetic domains. The columns of magnetic domains that are shown in FIG. 16 are into the page of FIG. 17. Thus, only the bottom-most magnetic domains in FIG. 16 are visible in FIG. 17. The magnetic domains are indicated in FIG. 17 by a single arrow pointing upward in a dotted box, and the absence of a magnetic domain is indicated by a dotted box that does not include an arrow.

With the columns of magnetic domains written into data storage layer 212 in FIG. 17, control system 104 may transfer the bits up stacked assembly 101. One example of transferring bits vertically is described in U.S. Pat. No. 7,388,776, which is incorporated by reference as if included in its entirety herein. Control system 104 operates to imprint the magnetic domains present in data storage layer 212 into data storage layer 222. FIG. 18 is another cross-sectional view of memory 100 in an exemplary embodiment. FIG. 18 shows the magnetic domains from data storage layer 212 imprinted in data storage layer 222. FIG. 19 is an isometric view illustrating the columns of magnetic domains transferred from one data storage layer to another data storage layer in an exemplary embodiment.

After transferring the columns of magnetic domains perpendicularly from data storage layer 212 to data storage layer 222 (see step 906 in FIG. 9), control system 104 may transfer the columns of magnetic domains laterally within the data storage layer 222 to other neighboring domain sites. Control system 104 may alternatively write another column of magnetic domains in the data storage layer 212 (see step 902) or transfer the columns of magnetic domains perpendicularly from data storage layer 222 to yet another data storage layer (see step 906).

Figure 20:
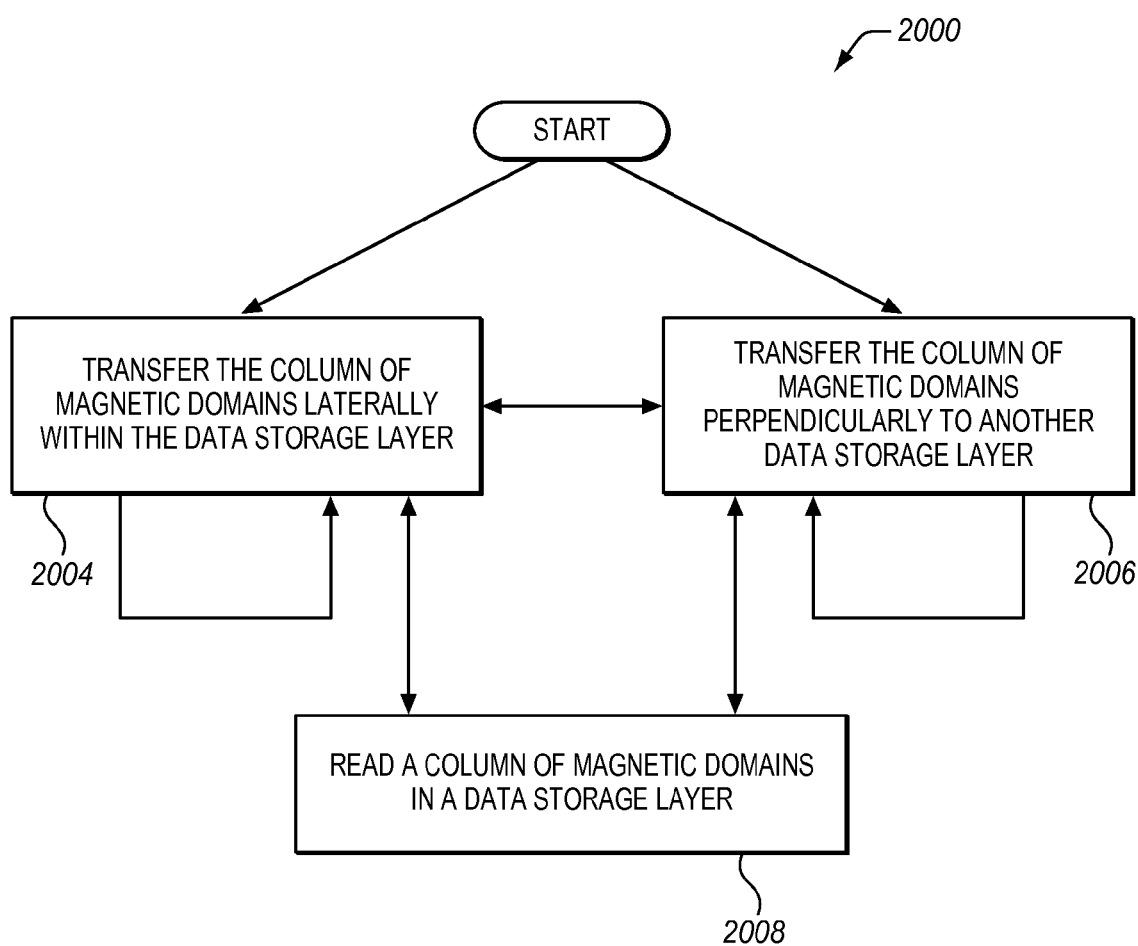
FIG. 20 is a flow chart illustrating a method of reading bits of data in the memory in an exemplary embodiment.

Those skilled in the art will appreciate that control system 104 may write magnetic domains one column at a time, and then transfer the magnetic domains laterally or perpendicularly within the stacked assembly 101 as desired. At some point, control system 104 may want to read a column of magnetic domains that are stored in the stacked assembly 101. FIG. 20 is a flow chart illustrating a method 2000 of reading bits of data in memory 100 in an exemplary embodiment. The steps of method 2000 will be described with reference to memory 100 in FIGS. 1-8. Also, the steps of the flow charts provided herein are not all inclusive and other steps, not shown, may be included. Further, the steps may be performed in an alternative order.

Before a column of magnetic domains may be read from data storage layer 212, the column of magnetic domains needs to be transferred to a read location in data storage layer 212 that is proximate to the read elements 312, 510. The column of magnetic domains may be stored in data storage layer 212 but needs to be transferred laterally to the read location. Alternatively, the column of magnetic domains may be stored in data storage layer 222, and needs to be transferred perpendicularly back to data storage layer 212. Thus, method 2000 includes the step of transferring the column of magnetic domains laterally within data storage layer 212 (step 2004). Method 2000 further includes the step of transferring the column of magnetic domains perpendicularly to another data storage layer (step 2006). Steps 2004 and/or 2006 are performed by control system 104 to move a column of magnetic domains to the read location. When the column of magnetic domains is transferred to the read location, control system 104 may control the read elements 312, 510 to read the magnetic domains. Method 2000 may then continue to read other columns of magnetic domains in a similar manner.

Figure 21:
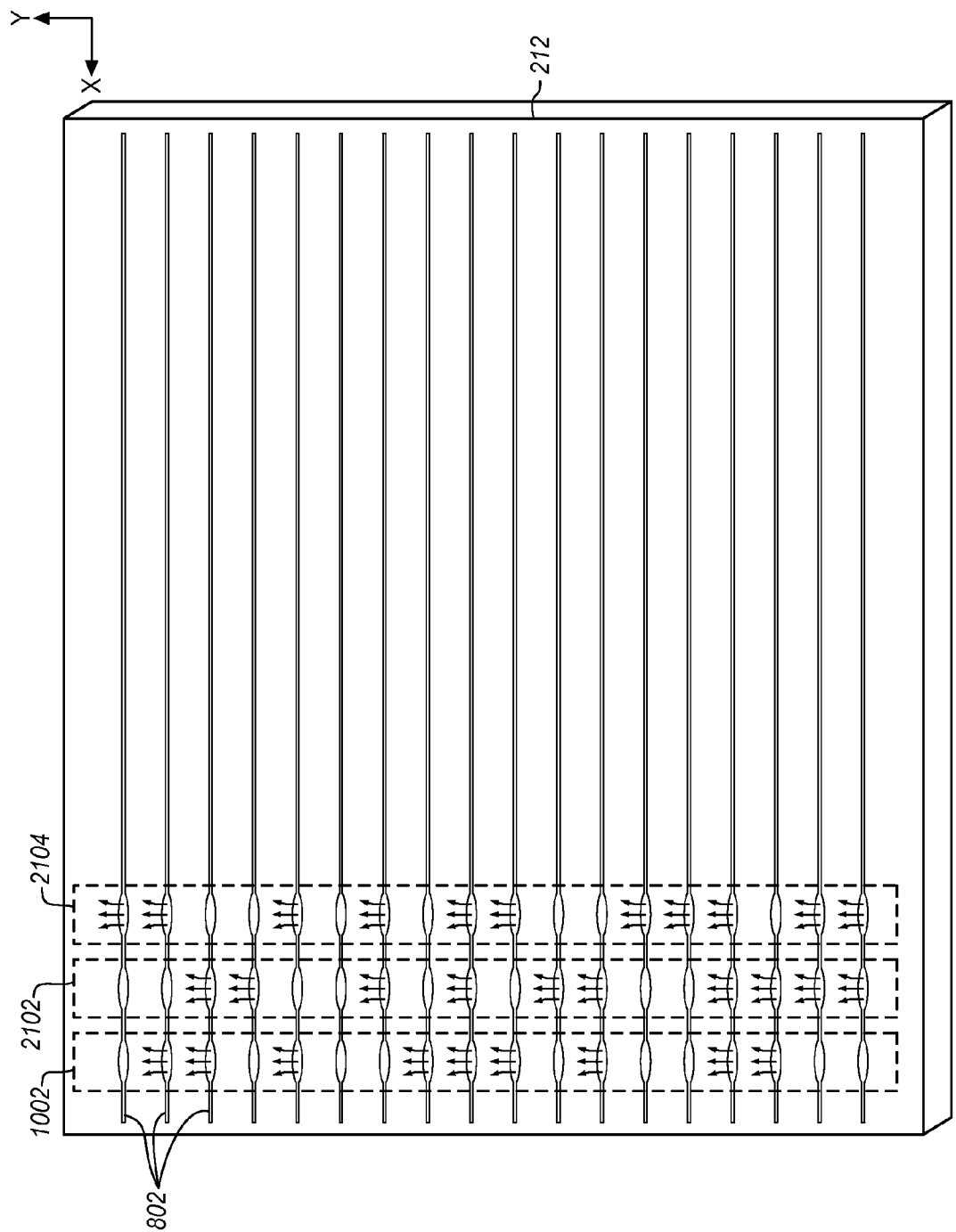
FIGS. 21-23 illustrate transferring a column of magnetic domains laterally in a data storage layer to read the magnetic domains in an exemplary embodiment.
Figure 22:
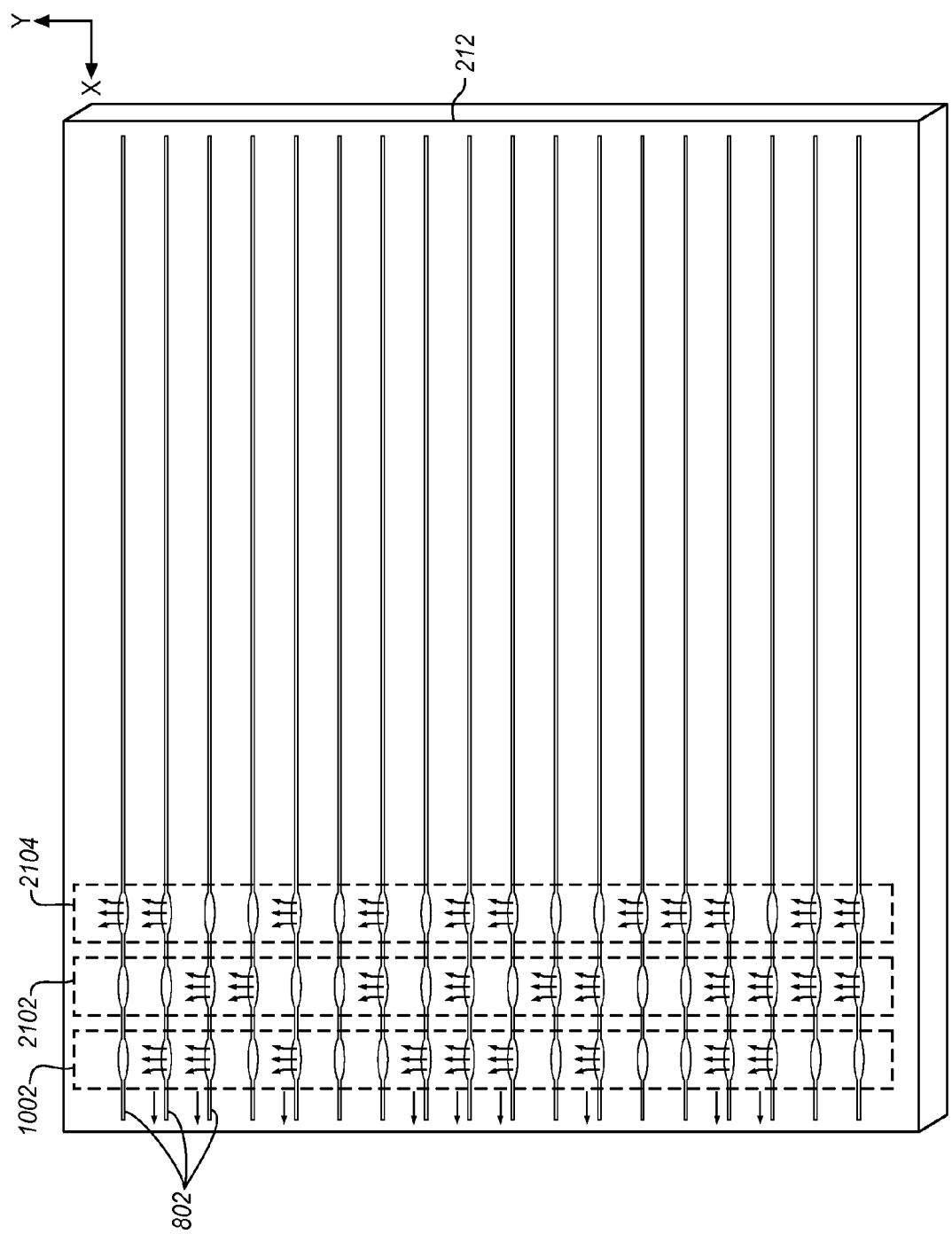
Figure 23:
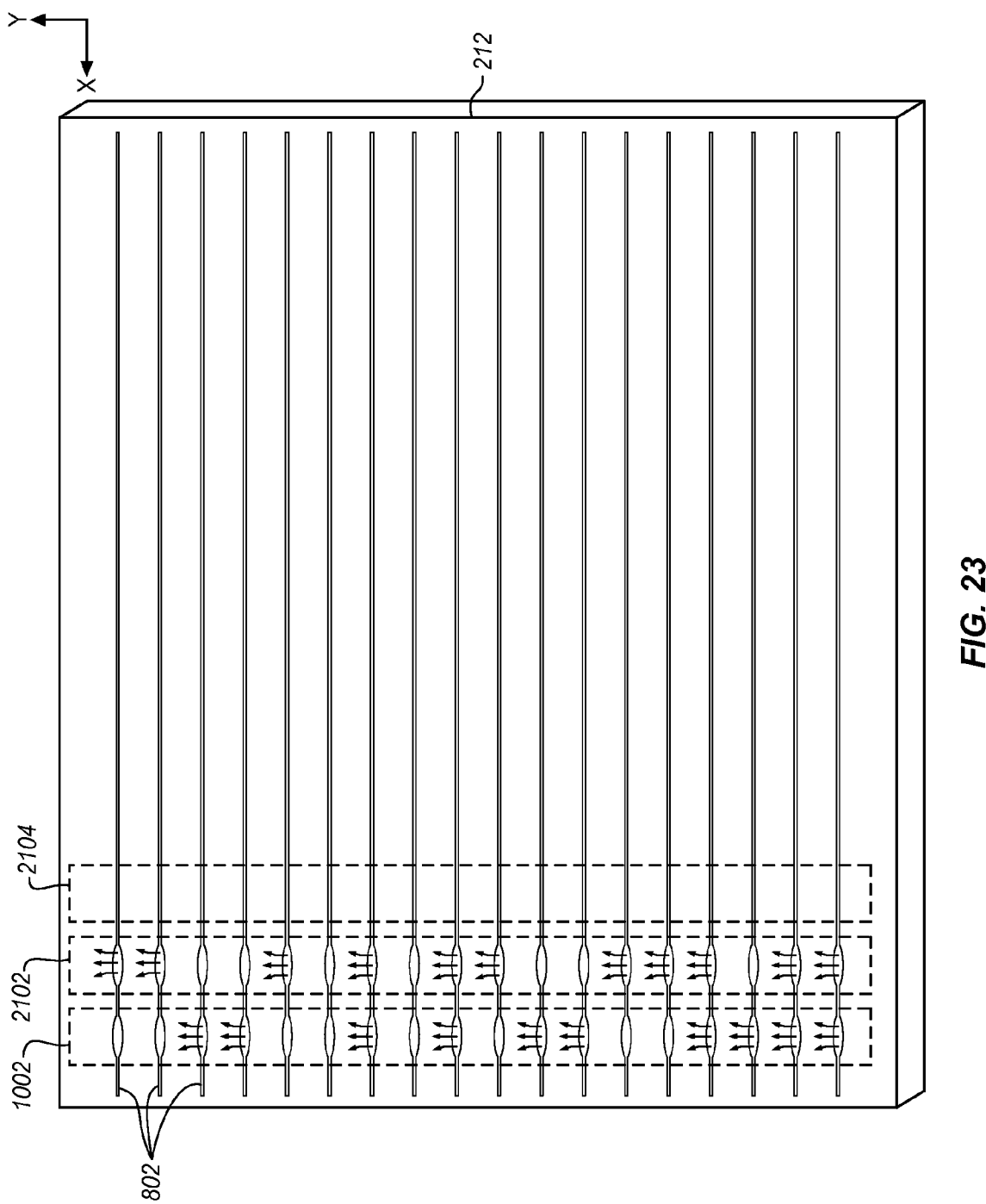

FIGS. 21-23 illustrate transferring a column of magnetic domains laterally in data storage layer 212 to read the magnetic domains in an exemplary embodiment. In FIG. 21, the read location 2102 is shown, which represents the location proximate to the read elements 312 where magnetic domains may be sensed by the read elements 312 (it is noted that the read location may vary depending on how the read elements are fabricated). Assume that control system 104 wants to read the column of magnetic domains presently storing in domain location 2104. To do so, control system 104 transfers the column of magnetic domains laterally (right to left in FIG. 21) within data storage layer 212. In FIG. 22, to transfer the column of magnetic domains to the read location 2102, control system 104 uses spin torque transfer to move the column of magnetic domains to a neighboring domain site, which is read location 2102. FIG. 23 illustrates the magnetic domains transferred from the domain location 2104 to read location 2102. With the column of magnetic domains transferred to read location 2102, the magnetic domains may be read by the read elements 312.

Looking at FIGS. 21-23, in order to transfer the column of magnetic domains from domain location 2104 to read location 2102, other columns of magnetic domains may need to be transferred laterally also, which is to the left in FIG. 21. Thus, one or more columns of magnetic domains may need to be temporarily offloaded from data storage layer 212. For example, the column of magnetic domains in initial write location 1002 (see FIG. 21) is offloaded from data storage layer 212 (see FIG. 23) when the columns of magnetic domains are shifted left. These columns of magnetic domains may be temporarily offloaded to an overflow storage system.

Figure 24:
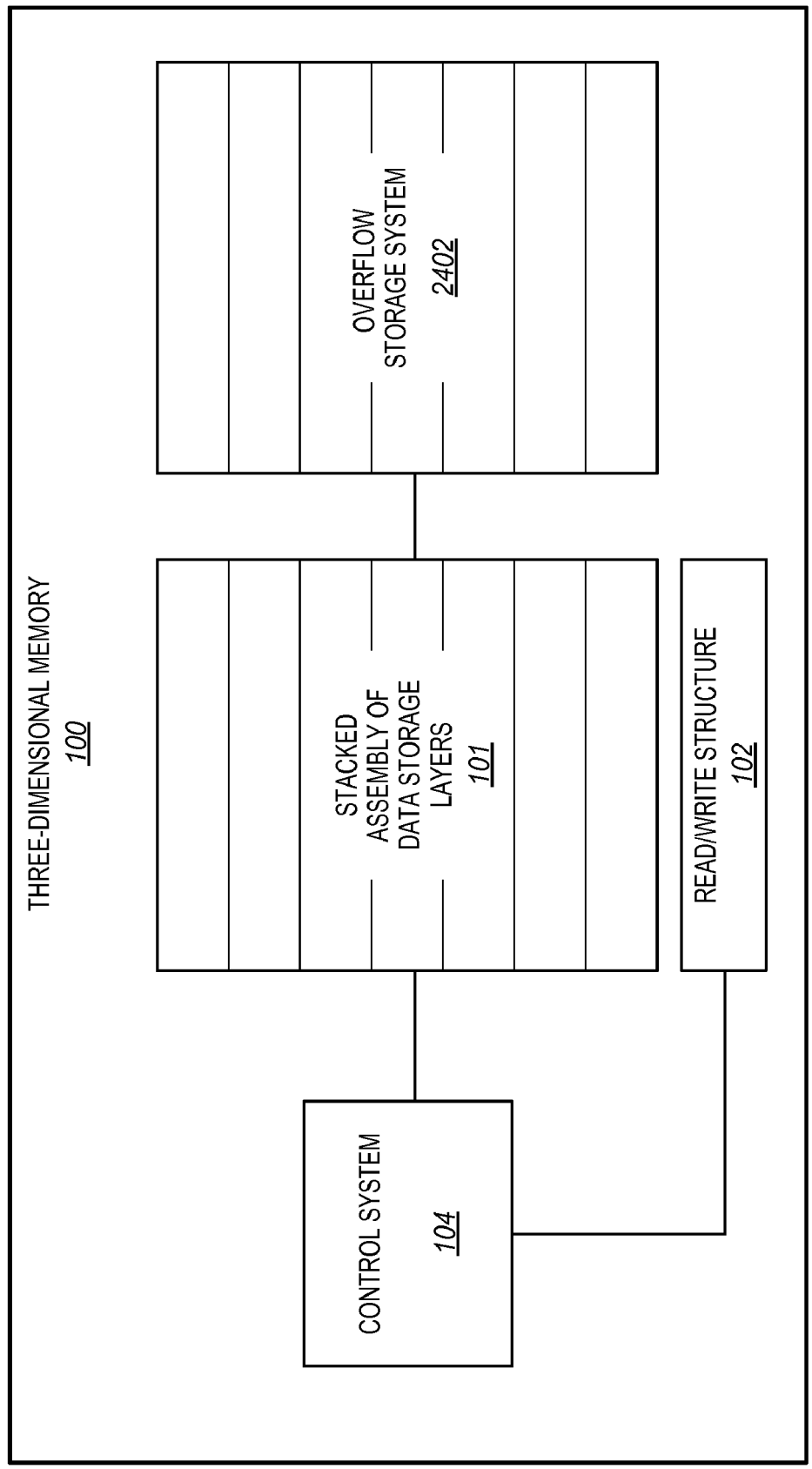
FIG. 24 illustrates a memory with an overflow storage system in an exemplary embodiment.

FIG. 24 illustrates memory 100 with an overflow storage system 2402 in an exemplary embodiment. The overflow storage system may represent another stacked assembly much like stacked assembly 101. Thus, overflow storage system 2402 may have a read/write structure (now shown) similar to read/write structure 102.

Looking at FIGS. 21-23, when the columns of magnetic domains are shifted left, control system 104 offloads the column of magnetic domains in domain location 1002 onto overflow storage system 2402. Similarly, each time a column of magnetic domains is shifted to the left in FIGS. 21-23, the column of domains is temporarily stored in overflow storage system 2402.

If one or more columns of magnetic domains are moved downward (perpendicularly) to data storage layer 212, then magnetic domains stored in data storage layer 212 may also be temporarily offloaded from data storage layer 212 to overflow storage system 2402.

By writing columns of bits into data storage layer 212 instead of writing an entire page of bits, the bit density of memory 100 is advantageously increased. When the columns of magnetic domains are transferred laterally within data storage layer 212, the columns of magnetic domains can be packed closer together. The spin-torque effect becomes more efficient as bit sizes are reduced. Consequently, the space between columns of magnetic domains is no longer limited by how closely the write elements can be fabricated next to each other, but is only limited by thermal stability requirements. Thus, the bit density of memory 100 may be increased.

Figure 25:
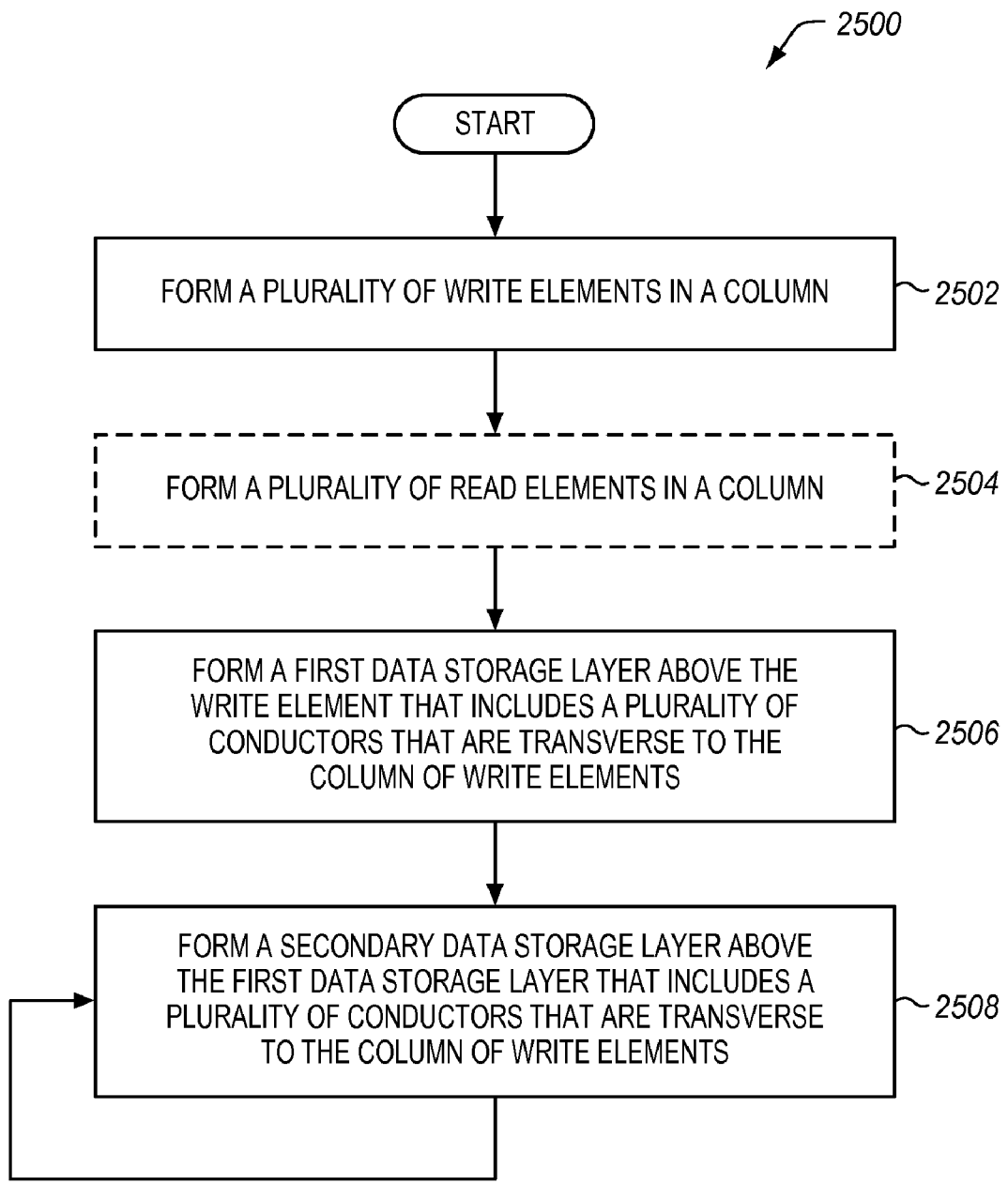
FIG. 25 is a flow chart illustrating a method of fabricating a three-dimensional memory in an exemplary embodiment.

FIG. 25 is a flow chart illustrating a method 2500 of fabricating a memory in an exemplary embodiment. Method 2500 will be described as fabricating memory 100 illustrated in the previous figures. However, method 2500 may be used to fabricate other memories.

Step 2502 comprises forming a plurality of write elements 310, 510 in a column 202. The write elements 310, 510 may be formed by fabricating a plurality of first current loops parallel to one another in a column, and also fabricating a second current loop orthogonal to the first current loops. The current loops may be formed from an electrically conductive material, such as Al or Cu. The first current loops and the second current loop are deposited in different layers so that they are not in contact. Write elements 310, 510 may alternatively be formed from spin-torque device or other systems.

Step 2504 comprises the optional step of forming a plurality of read elements 312, 510 in a column 204. The step 2504 of forming read elements 312, 510 may comprise multiple deposition steps. For example, if the read elements 312, 510 comprise MR sensors, then each read element may be formed from multiple thin films of material. Thus, step 2504 may comprise multiple steps of depositing a layer of material, and removing unwanted portions to form the MR sensors.

Step 2506 comprises forming a first data storage layer 212 above the write elements 310, 510 (and optionally the read elements 312, 510) that includes a plurality of magnetic conductors 802 that are transverse to the column 202 of write elements 310. The term "above" as used herein means "on" or "proximate to". The first data storage layer 212 may be formed by depositing a magnetic material, such as TbFeCo or CoPt multi-layers, and then patterning the magnetic material into magnetic conductors 802. An insulating material may then be deposited between magnetic conductors 802, as well as other layers of the first storage stack 210.

Step 2508 comprises forming a secondary data storage layer 222 above the first data storage layer 212. Like data storage layer 212, the secondary data storage layer 222 includes a plurality of magnetic conductors. The magnetic conductors may be formed transverse to the column 202 of write elements 310. Alternatively, the magnetic conductors may be formed perpendicular to the magnetic conductors 802 in data storage layer 212. Step 2508 may be performed a number of times to form multiple data storage layers 232, 242 of stacked assembly 101. Thus, steps 2506-2508 create the three-dimensional aspect of memory 100.

Figure 26:
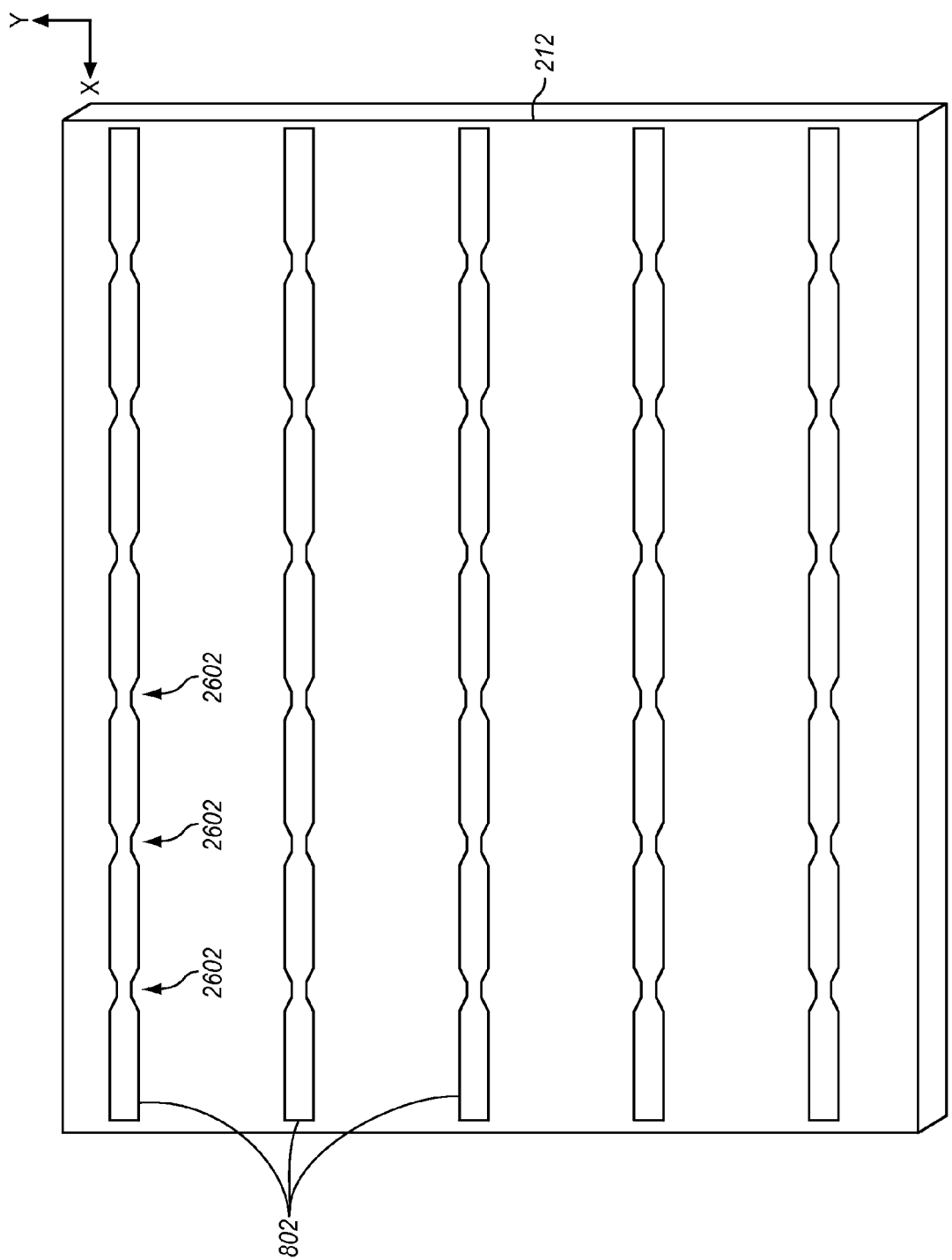
FIG. 26 is a top view of a data storage layer showing conductors in an exemplary embodiment.

The magnetic conductors fabricated in steps 2506 and 2508 may have a structure that helps to control where the magnetic domains are positioned when transferred within data storage layer 212. FIG. 26 is a top view of data storage layer 212 showing magnetic conductors 802 in an exemplary embodiment. Instead of being patterned as a straight line or trace, each magnetic conductor 802 may be patterned with notches 2602 along its length. At the location of each notch 2602, the width of magnetic conductor 802 narrows. If a spin-polarized current pulse is injected into magnetic conductor 802, the current pulse will cause a magnetic domain to drift along magnetic conductor 802 until it reaches a notch 2602. The narrowing of conductor 802 at the notch 2602 will cause the drift of the magnetic domain to slow or stop. Thus, memory designer can control how the magnetic domains propagate along a magnetic conductor 802.

Control system 104 as shown in the figures or described herein may be implemented as hardware, software, firmware, or some combination of these. For example, control system 104 may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non volatile storage, logic, or some other physical hardware component or module.

Also, control system 104 may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific embodiments were described herein, the scope of the invention is not limited to those specific embodiments. The scope of the invention is defined by the following claims and any equivalents thereof.

We claim:

1. A three-dimensional memory comprising:
a plurality of data storage layers on top of one another to form a three-dimensional structure, where each data storage layer is able to store bits of data in the form of magnetic domains; and
a column of write elements proximate to a first one of the data storage layers that is operable to write a column of magnetic domains to the first data storage layer representing a column of bits;
wherein the first data storage layer is patterned into a plurality of magnetic conductors aligned transverse to the column of write elements, wherein the magnetic conductors are operable to transfer the column of magnetic domains laterally within the first data storage layer.

2. The three-dimensional memory of claim 1 further comprising:
a control system operable to inject spin-polarized current pulses in the magnetic conductors to transfer the column of magnetic domains laterally within the first data storage layer to a neighboring domain site.

3. The three-dimensional memory of claim 2 wherein:
the magnetic conductors are fabricated with notches along their length where a width of the magnetic conductors narrows.

4. The three-dimensional memory of claim 1 further comprising:
a control system operable to transfer the column of magnetic domains perpendicularly from the first data storage layer to another data storage layer.

5. The three-dimensional memory of claim 1 wherein the write elements comprise:
a plurality of first current loops parallel to one another; and
a second current loop orthogonal to the first current loops.

6. The three-dimensional memory of claim 5 further comprising:
a control system operable to selectively inject current through the first current loops and the second current loop to create magnetic fields that write the column of magnetic domains into the first data storage layer.

7. The three-dimensional memory of claim 1 further comprising:
a column of read elements proximate to the first data storage layer that is operable to sense the column of magnetic domains from the first data storage layer to read the column of bits.

8. The three-dimensional memory of claim 7 wherein the read elements comprise magnetoresistance (MR) sensors.

9. The three-dimensional memory of claim 7 further comprising:
a control system operable to measure resistances of the read elements to read the column of bits from the first data storage layer.

10. The three-dimensional memory of claim 1 wherein:
the column of write elements comprises integrated read/write elements.

11. The three-dimensional memory of claim 10 wherein the integrated read/write elements comprise spin-torque devices.

12. A three-dimensional memory comprising:
a first storage stack including a first data storage layer defining a first X-Y plane, wherein the first data storage layer is operable to store bits of data;
at least one secondary storage stack fabricated on the first storage stack, wherein the at least one secondary storage stack includes a second data storage layer defining a second X-Y plane that is parallel to the first X-Y plane; and
a column of write elements proximate to the first data storage layer that is operable to write a column of magnetic domains to the first data storage layer in the Y-direction;
wherein the first data storage layer is patterned into a plurality of magnetic conductors aligned transverse to the column of write elements in the X-direction, wherein the magnetic conductors are operable to transfer the column of magnetic domains in the X-direction within the first data storage layer.

13. The three-dimensional memory of claim 12 further comprising:
a control system operable to inject spin-polarized current pulses in the magnetic conductors to transfer the column of magnetic domains in the X-direction within the first data storage layer.

14. The three-dimensional memory of claim 13 wherein:
the magnetic conductors are fabricated with notches along their length where a width of the magnetic conductors narrows.

15. The three-dimensional memory of claim 12 further comprising:
a control system operable to transfer the column of magnetic domains in the Z-direction from the first data storage layer to the second data storage layer.

16. The three-dimensional memory of claim 12 wherein the write elements comprise:
a plurality of first current loops parallel to one another; and
a second current loop orthogonal to the first current loops.

17. The three-dimensional memory of claim 16 further comprising:
a control system operable to selectively inject current through the first current loops and the second current loop to create magnetic fields that write the column of magnetic domains into the first data storage layer.

18. The three-dimensional memory of claim 12 further comprising:
a column of read elements proximate to the first data storage layer that is operable to sense the column of magnetic domains in the Y-direction from the first data storage layer to read a column of bits.

19. The three-dimensional memory of claim 18 wherein the read elements comprise magnetoresistance (MR) sensors.

20. The three-dimensional memory of claim 18 further comprising:
a control system operable to measure resistances of the read elements to read the column of bits from the first data storage layer.

21. The three-dimensional memory of claim 12 wherein:
the column of write elements comprises integrated read/write elements.

22. The three-dimensional memory of claim 21 wherein the integrated read/write elements comprise spin-torque devices.

23. A method of fabricating a three-dimensional memory, the method comprising:
forming a plurality of write elements in a column;
forming a first data storage layer above the write elements, wherein the first data storage layer is patterned into a plurality of magnetic conductors that are transverse to the column of write elements, and the magnetic conductors are operable to transfer a column of magnetic domains laterally within the first data storage layer; and
forming at least one secondary data storage layer on the first data storage layer, wherein the at least one secondary data storage layer is patterned into a plurality of magnetic conductors.

24. The method of claim 23 further comprising:
forming a plurality of read elements in a column.

25. The method of claim 23 wherein the magnetic conductors in the at least one secondary data storage layer are fabricated transverse to the magnetic conductors in the first data storage layer.

* * * * *